US012592699B2

(12) United States Patent
Peng et al.

(10) Patent No.: US 12,592,699 B2
(45) Date of Patent: Mar. 31, 2026

(54) ELECTRONIC DEVICE

(71) Applicant: Huawei Technologies Co., Ltd., Shenzhen (CN)

(72) Inventors: Weibo Peng, Shenzhen (CN); Cheng Gou, Xi'an (CN); Jian Wang, Xi'an (CN); Zijian Su, Xi'an (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 764 days.

(21) Appl. No.: 17/789,101

(22) PCT Filed: Oct. 26, 2020

(86) PCT No.: PCT/CN2020/123663
§ 371 (c)(1),
(2) Date: Jun. 24, 2022

(87) PCT Pub. No.: WO2021/129110
PCT Pub. Date: Jul. 1, 2021

(65) Prior Publication Data
US 2023/0032019 A1 Feb. 2, 2023

(30) Foreign Application Priority Data

Dec. 26, 2019 (CN) .......................... 201911364753.X

(51) Int. Cl.
*H03K 17/96* (2006.01)
*H01Q 21/08* (2006.01)
*H01Q 1/24* (2006.01)
(52) U.S. Cl.
CPC ........... *H03K 17/962* (2013.01); *H01Q 21/08* (2013.01); *H01Q 1/243* (2013.01)

(58) Field of Classification Search
CPC ............ H01Q 1/22; H01Q 1/243; H01Q 1/52
See application file for complete search history.

(56) References Cited

U.S. PATENT DOCUMENTS 8,649,833 B1* 2/2014 Lee ........................ H04M 1/026
455/82
9,905,908 B2* 2/2018 Tang ...................... H01Q 5/371
(Continued)

FOREIGN PATENT DOCUMENTS

CN 102187249 A 9/2011
CN 103138794 A 6/2013
(Continued)

OTHER PUBLICATIONS

Arttu Huttunen et al.,"Capacitive Sensing of Antenna Loading With an R C Voltage Divider in a Tunable Antenna",Oct. 9, 2012 ,total:5pages.
(Continued)

*Primary Examiner* — Hasan Islam
(74) *Attorney, Agent, or Firm* — WOMBLE BOND DICKINSON (US) LLP

(57) ABSTRACT

An electronic device includes a first antenna unit. The first antenna unit includes a first radiator, the first radiator is configured to receive and transmit a radio frequency signal, and the first radiator is further configured to sense capacitance or a capacitance change between the first radiator and a detected object when the detected object approaches. The electronic device further includes a sensor chip. The sensor chip is configured to obtain the capacitance or the capacitance change, to determine a proximity of the detected object relative to the first radiator, and the sensor chip is electrically connected to a minimum-voltage point on the first radiator by a conducting wire.

13 Claims, 9 Drawing Sheets

(56)                References Cited

U.S. PATENT DOCUMENTS

| 10,424,844 | B2 |  | 9/2019 | Lee et al. |
| 10,802,356 | B2 | * | 10/2020 | Harrold ............... G06F 3/04184 |
| 2012/0214412 | A1 |  | 8/2012 | Schlub et al. |
| 2013/0043315 | A1 | * | 2/2013 | Carr ................. G06K 19/07771 |
|  |  |  |  | 235/492 |
| 2014/0315606 | A1 |  | 10/2014 | You et al. |
| 2014/0333494 | A1 |  | 11/2014 | Huang |
| 2014/0354293 | A1 |  | 12/2014 | Wong et al. |
| 2015/0171911 | A1 | * | 6/2015 | Yang ....................... H04W 4/80 |
|  |  |  |  | 455/280 |
| 2015/0200447 | A1 |  | 7/2015 | Tang et al. |

FOREIGN PATENT DOCUMENTS

| CN | 203799390 | U | 8/2014 |
| CN | 102089989 | B | 11/2014 |
| CN | 104269605 | A | 1/2015 |
| CN | 204947096 | U | 1/2016 |
| CN | 105552538 | A | 5/2016 |
| CN | 106094984 | A | 11/2016 |
| CN | 106229614 | A | 12/2016 |
| CN | 106764960 | A | 5/2017 |
| CN | 107547101 | A | 1/2018 |
| CN | 107548145 | A | 1/2018 |
| CN | 108540157 | A | 9/2018 |
| WO | 2019103505 | A1 | 5/2019 |

OTHER PUBLICATIONS

Peng Weibo, Introduction of Antenna Measurement and Design of Positioner System, China Excellent Doctoral Dissertation Full-text Database (Master) Information Technology Series, May 15, 2013, with an English Abstract, 53 pages.
Yang Ming et al.,"Design of Electrically Small Antenna in Micro Wireless Sensor",Dec. 1, 2016,total:4pages.

* cited by examiner

410

412   411

421

423   420

422

Sensor integrated
circuit 402                                421

403

410                                420

401

405

404                                423

430                                422

(a)                              (b)

(c)                (d)      (e)      (f)

(a)

(b)

ELECTRONIC DEVICE

CROSS-REFERENCE TO RELATED APPLICATIONS

This application is a National Stage of International Patent Application No. PCT/CN2020/123663, filed on Oct. 26, 2020, which claims priority to Chinese Patent Application No. 201911364753.X, filed on Dec. 26, 2019, both of which are incorporated herein by reference in their entirety.

TECHNICAL FIELD

Embodiments of this application relate to the field of terminal technologies, and more specifically, to an electronic device.

BACKGROUND

With continuous progress of science and technology, electronic devices such as a smartphone develop rapidly. Electronic devices have more functions and more enhanced performance. Sensors behind an electronic device play an important role in improving user interaction experience.

A capacitive sensor (capacitive sensor) includes a sensor pad and a sensor chip, and can detect a proximity or a distance level of a detected object based on a capacitance change between the detected object and the sensor pad.

To effectively use space in an electronic device, a radiator of an antenna is used as a sensor pad of an existing capacitive sensor, so that a capacitive sensing signal is transmitted in a radio frequency path. A lumped component such as a capacitor or an inductor is connected to the path, so that a radio frequency signal and the capacitive sensing signal can be isolated and then are transmitted to the radio frequency path and a sensor path respectively. However, the radio frequency signal and the capacitive sensing signal interfere with each other when being transmitted in the same path, which affects detection accuracy of the capacitive sensor.

SUMMARY

Embodiments of this application provide an electronic device, to improve detection accuracy of a sensor in the electronic device.

According to a first aspect, an electronic device is provided. The electronic device includes a first antenna unit. The first antenna unit includes a first radiator, the first radiator is configured to receive and transmit a radio frequency signal, and the first radiator is further configured to sense capacitance or a capacitance change between the first radiator and a detected object when the detected object approaches. The electronic device further includes a sensor chip. The sensor chip is configured to obtain the capacitance or the capacitance change, to determine a proximity of the detected object relative to the first radiator, and the sensor chip is electrically connected to a minimum-voltage point on the first radiator by a conducting wire.

In embodiments of this application, the conducting wire is led out from the minimum-voltage point on the radiator of the antenna unit and is connected to the sensor chip, so that a capacitive sensor system can be formed. In this way, a capacitive sensing path of the capacitive sensor can be separated from a radio frequency path of the antenna unit, and a capacitive sensing current of the sensor is transmitted to the sensor chip from the led-out conducting wire. This reduces or avoids mutual interference between the capacitive sensing path and the radio frequency path, and improves detection accuracy of the capacitive sensor.

In addition, because the capacitive sensing path of the capacitive sensor is separated from the radio frequency path of the antenna unit, an isolation component such as a capacitor or an inductor does not need to be disposed to isolate a capacitive sensing signal from a radio frequency signal, so that a structure can be simplified. The radio frequency path does not need to transmit a capacitive sensing current, so that flexibility of debugging the radio frequency path is improved.

In embodiments of this application, the conducting wire is separately led out from the minimum-voltage point on the radiator. This does not affect performance of the antenna. The conducting wire is led out from the minimum-voltage point on the radiator, so that the capacitive sensing path of the capacitive sensor is separated from the radio frequency path of the antenna unit, and an isolation component such as a capacitor or an inductor does not need to be disposed in the radio frequency path and the sensor path for isolation.

In one embodiment, the electronic device further includes a second antenna unit that includes a second radiator, a minimum-voltage point on the second radiator is electrically connected to the sensor chip by a conducting wire, and the conducting wires connected to the first radiator and the second radiator are combined into one path or a plurality of paths that are connected to the sensor chip.

It should be understood that, when the conducting wires led out from the radiator of the first antenna unit and the radiator of the second antenna unit are combined into the plurality of paths that are electrically connected to the sensor chip, a current sensed by a radiator of each antenna unit is transmitted to the sensor chip on only one path.

When radiators of a plurality of antenna units are multiplexed as sensor pads of the capacitive sensor, an area of the sensor pads is increased, so that a capacitive sensing current can be increased, and detection accuracy of the sensor is improved. Further, compared with using a radiator of a single antenna unit as a sensor pad, using the radiators of the plurality of antenna units can increase a detection distance of the capacitive sensor and improve detection sensitivity of the capacitive sensor. That is, when a detected object is far away from the radiator, a current can be generated in the radiator, so that the current is detect by the sensor chip.

Because the radiators (that is, a plurality of sensor pads) of the plurality of antenna units are connected to the sensor chip on a plurality of paths, the sensor chip may calculate a plurality of distances between the detected object and the radiators or distances between a plurality of detected objects and the radiators based on a plurality of paths of capacitive sensing currents. Therefore, a precise location of the detected object can be obtained.

In one embodiment, the first antenna unit and the second antenna unit belong to a same antenna array.

When the first antenna unit and the second antenna unit belong to the same antenna array, it is convenient to package the antenna array. It should be understood that the antenna array may include a plurality of first antenna units and/or a plurality of second antenna units.

In one embodiment, the first antenna unit is any one of the following antennas: a monopole antenna, a dipole antenna, a microstrip antenna, a patch antenna, a slot antenna, an inverted-F antenna, a planar inverted-F antenna, and a ceramic antenna.

In one embodiment, a feeding manner of the first antenna unit is direct feeding or coupled feeding, and the direct feeding includes microstrip feeding and probe feeding.

In one embodiment, the conducting wire is a low-pass high-resistance wire.

In embodiments of this application, the conducting wire led out from the minimum-voltage point on the radiator of the antenna is a low-pass high-resistance wire that presents high resistance to a radio frequency band. In this way, a high-frequency pilot wave corresponding to an electromagnetic wave is not transmitted on the conducting wire to the sensor chip.

In one embodiment, a first high-pass filter circuit is disposed on a path between the first radiator and the sensor chip, and the first high-pass filter circuit is configured to filter out the radio frequency signal.

To further reduce interference of a radio frequency signal to a capacitive sensing signal, in embodiments of this application, the first high-pass filter circuit may be further disposed in the capacitive sensing path, to filter out the radio frequency signal of the antenna unit.

In one embodiment, when the first antenna unit is a patch antenna, the first radiator includes one or more layers of conductor patches, and the conducting wire is connected to a layer of conductor patch in the one or more layers of conductor patches.

In one embodiment, the conducting wire is connected to a surface layer conductor patch in the one or more layers of conductor patches.

When the antenna unit is the patch antenna, the surface layer conductor patch is used as a sensor pad of the capacitive sensor, so that impact of another conductor patch of the antenna unit can be reduced. In addition, the surface layer conductor patch is closest to the detected object, a distance that can be detected is farthest, and detection sensitivity of the capacitive sensor can be improved.

In one embodiment, when a feeding manner of the first antenna unit is the direct feeding, a second high-pass filter circuit is connected in series to a radio frequency path of the first antenna unit, and is configured to block a low-frequency signal corresponding to the capacitance or the capacitance change.

In a case of direct feeding, to further reduce impact of a capacitive sensing signal on the radio frequency back-end, in embodiments of this application, the second high-pass filter circuit may be further disposed in the radio frequency path to block the capacitive sensing signal.

In one embodiment, the first antenna unit further includes a feeding line, and when the feeding line and the conducting wire are connected to a same conductor patch, a second high-pass filter circuit is connected in series to a radio frequency path of the first antenna unit, and is configured to block a low-frequency signal corresponding to the capacitance or the capacitance change.

In one embodiment, the second high-pass filter circuit is a capacitor circuit.

In one embodiment, when the first antenna unit is a patch antenna, a shape of the patch antenna is any one of the following shapes: a square, a rectangle, a triangle, a circle, an ellipse, and an H shape.

In one embodiment, when a working mode of the first antenna unit is a half-wavelength mode, the minimum-voltage point on the first radiator is located at a center of the first radiator.

In one embodiment, the sensor chip and the first antenna unit are packaged as a whole.

The sensor chip and the first antenna unit are packaged as a whole, so that a device volume can be reduced, and internal space of the electronic device can be saved.

According to a second aspect, an electronic device is provided. The electronic device includes a first antenna unit and a sensor chip, where the first antenna unit includes a first radiator and a feeding line, and the feeding line is in direct contact with the first radiator or the feeding line performs coupled feeding for the first radiator; and the first radiator is electrically connected to the sensor chip by a conducting wire, and a location at which the conducting wire is connected to the first radiator is a minimum-voltage point on the first radiator.

In embodiments of this application, the conducting wire is led out from the minimum-voltage point on the radiator of the antenna unit and is connected to the sensor chip, so that a capacitive sensor system is formed. In this way, a capacitive sensing path of the capacitive sensor can be separated from a radio frequency path of the antenna unit, and a capacitive sensing current of the sensor is transmitted to the sensor from the led-out conducting wire. This reduces or avoids mutual interference between the capacitive sensing path and the radio frequency path, and improves detection accuracy of the capacitive sensor.

In one embodiment, the electronic device further includes a second antenna unit that includes a second radiator, a minimum-voltage point on the second radiator is electrically connected to the sensor chip by a conducting wire, and the conducting wires connected to the first radiator and the second radiator are combined into one path or a plurality of paths that are connected to the sensor chip.

In one embodiment, the first antenna unit and the second antenna unit belong to a same antenna array.

In one embodiment, the first antenna unit is any one of the following antennas: a monopole antenna, a dipole antenna, a microstrip antenna, a patch antenna, a slot antenna, an inverted-F antenna, a planar inverted-F antenna, and a ceramic antenna.

In one embodiment, the conducting wire is a low-pass high-resistance wire.

In one embodiment, a first high-pass filter circuit is disposed on a path between the first radiator and the sensor chip.

In one embodiment, when the first antenna unit is a patch antenna, the first radiator includes one or more layers of conductor patches, and the conducting wire is connected to a layer of conductor patch in the one or more layers of conductor patches.

In one embodiment, the conducting wire is connected to a surface layer conductor patch in the one or more layers of conductor patches.

In one embodiment, in a case in which the feeding line is in direct contact with the first radiator, a second high-pass filter circuit is connected in series to a radio frequency path of the first antenna unit.

In one embodiment, when the feeding line and the conducting wire are connected to a same conductor patch, a second high-pass filter circuit is connected in series to a radio frequency path of the first antenna unit.

In one embodiment, the second high-pass filter circuit is a capacitor circuit.

In one embodiment, when the first antenna unit is a patch antenna, a shape of the patch antenna is any one of the following shapes: a square, a rectangle, a triangle, a circle, an ellipse, and an H shape.

In one embodiment, when a working mode of the first antenna unit is a half-wavelength mode, the minimum-voltage point on the first radiator is located at a center of the first radiator.

In one embodiment, the sensor chip and the first antenna unit are packaged as a whole.

DESCRIPTION OF EMBODIMENTS

The following describes technical solutions in this application with reference to the accompanying drawings. It is clear that the described embodiments are merely some but not all of embodiments of this application.

The electronic device in embodiments of this application may include a handheld device, an in-vehicle device, a wearable device, a computing device, or another processing device connected to a wireless modem. The electronic device may further include a cellular phone, a smartphone, a personal digital assistant (PDA) computer, a tablet computer, a portable computer, a laptop computer, a smart watch, and a smart wristband, a vehicle-mounted computer, or another electronic device that can implement communication. A specific form of the electronic device is not specially limited in embodiments of this application. In some embodiments, the electronic device in embodiments of this application may be a terminal or a terminal device.

Figures 1, 2:
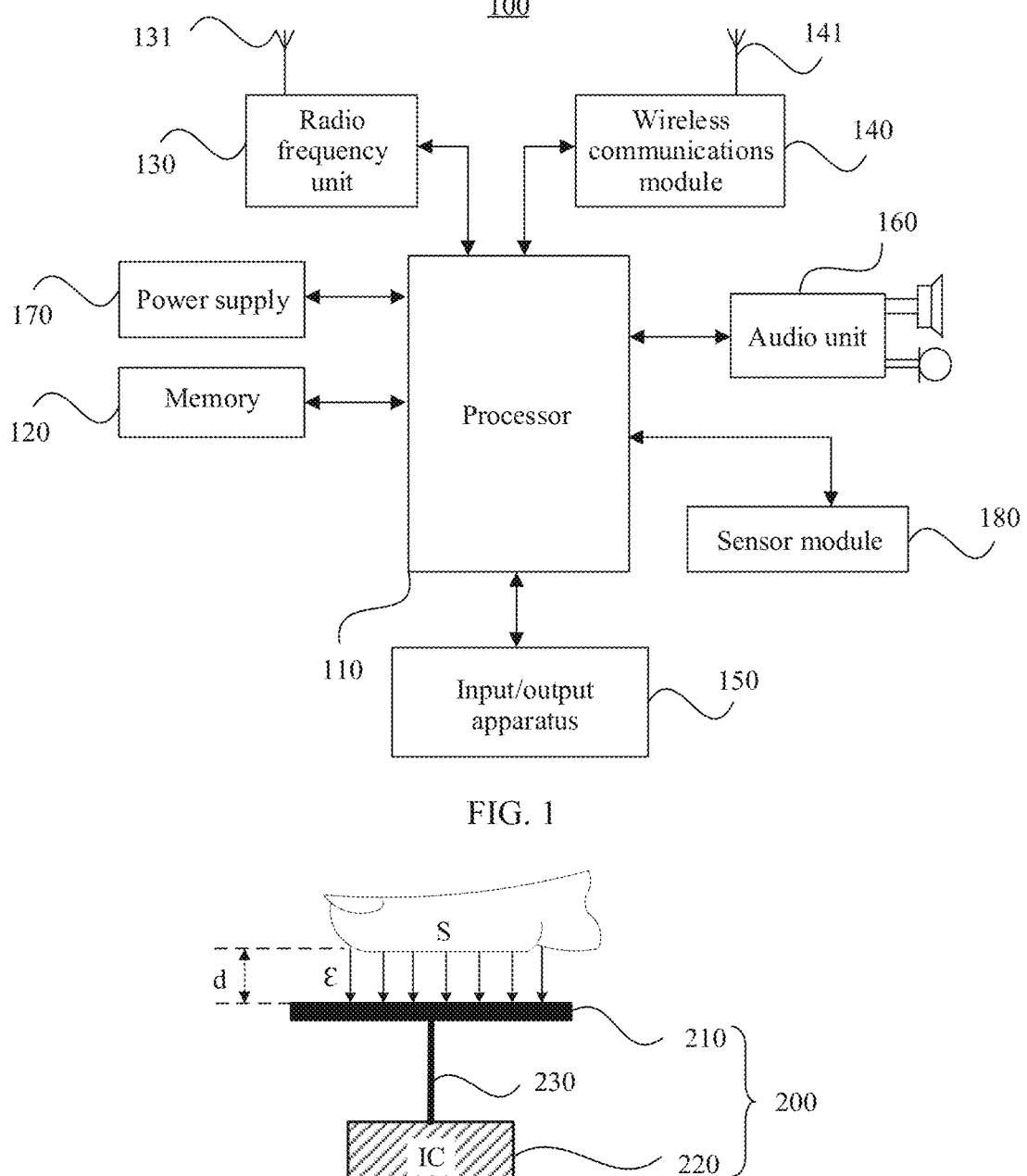
FIG. 1 is a schematic diagram of a structure of an electronic device.
FIG. 2 is a schematic diagram of a structure of a capacitive sensor.

For example, FIG. 1 is a schematic diagram of a structure of an electronic device 100. As shown in FIG. 1, the electronic device 100 includes a processor 110, a memory 120, a radio frequency unit 130, a wireless communications module 140, an input/output apparatus 150, an audio unit 160, a power supply 170, a sensor module 180, and the like.

It may be understood that the structure shown in embodiments of this application does not constitute a specific limitation on the electronic device 100. In some other embodiments of this application, the electronic device 100 may include more or fewer components than those shown in the figure, or some components may be combined, or some components may be split, or different component arrangements may be used. The components shown in the figure may be implemented through hardware, software, or a combination of software and hardware.

The processor 110 may be configured to process a communication protocol and communication data, control the electronic device 100, execute a software program, process data of the software program, and so on. The processor 110 may include one or more processing units. For example, the processor 110 may include an application processor (AP), a modem processor, a graphics processing unit (GPU), an image signal processor (ISP), a controller, a video codec, a digital signal processor (DSP), a baseband processor, a neural-network processing unit (NPU), and/or the like. Different processing units may be independent devices, or may be integrated into one or more processors.

In some embodiments, the processor 110 may include one or more interfaces. The interface may include an inter-integrated circuit (I2C) interface, an inter-integrated circuit sound (I2S) interface, a pulse code modulation (PCM) interface, a universal asynchronous receiver/transmitter (UART) interface, a mobile industry processor interface (mobile industry processor interface, MIPI), a general-purpose input/output (GPIO) interface, a subscriber identity module (SIM) interface, a universal serial bus (USB) interface, and/or the like.

The memory 120 is configured to store instructions and data, and mainly includes an internal memory and an external storage card such as a Micro SD card. The internal memory may be configured to store computer-executable program code. The executable program code includes instructions. The processor 110 performs various function applications and data processing of the electronic device 100 by running the instructions stored in the internal memory. The internal memory may include a program storage area and a data storage area. The program storage area may store an operating system, an application required by at least one function (for example, a sound playing function or an image playing function), and the like. The data storage area may store data (for example, audio data and an address book) and the like created when the electronic device 100 is used. In addition, the internal memory may include a high-speed random access memory, or may include a nonvolatile memory such as at least one magnetic disk storage device, a flash memory, or a universal flash storage (universal flash storage, UFS). The external storage card may extend a storage capability of the electronic device 100. The external storage card communicates with the processor 110 through an external memory interface, to implement a data storage function, for example, to store files such as music and a video in the external storage card.

For ease of description, FIG. 1 shows only one memory 120 and one processor 110. An actual electronic device may include one or more processors and one or more memories. The memory 120 may also be referred to as a storage medium, a storage device, or the like. The memory 120 may be disposed independent of the processor, or may be integrated with the processor. This is not limited in embodiments of this application.

The electronic device 100 may implement a wireless communication function of the electronic device 100 by using the antenna 131, the antenna 141, the radio frequency unit 130, the wireless communications module 140, the modem processor, the baseband processor, and the like.

The antenna 131 and the antenna 141 are configured to transmit and receive electromagnetic wave signals. Each antenna in the electronic device 100 may be configured to cover one or more communications frequency bands. Different antennas may further be multiplexed, to improve antenna utilization. For example, the antenna 131 may be multiplexed as a diversity antenna in a wireless local area network. In some other embodiments, the antenna may be used in combination with a tuning switch.

The radio frequency unit 130 may provide a solution that is applied to the electronic device 100 and that includes wireless communications technologies such as 2G, 3G, 4G, and 5G. The radio frequency unit 130 may include at least one filter, a switch, a power amplifier, a low noise amplifier (LNA), and the like. When data is sent to the electronic device, the radio frequency unit 130 may receive an electromagnetic wave through the antenna 131, perform processing such as filtering and amplification on the received electromagnetic wave, and transmit a processed electromagnetic wave to the modem processor for demodulation. When data needs to be sent, the radio frequency unit 130 may further amplify a signal modulated by the modem processor, and convert the signal into an electromagnetic wave for radiation through the antenna 131. In some embodiments, at least some function modules in the radio frequency unit 130 may be disposed in the processor 110. In some embodiments, at least some function modules in the radio frequency unit 130 may be disposed in a same device as at least some modules in the processor 110. The modem processor may include a modulator and a demodulator. The modulator is configured to modulate a to-be-sent low-frequency baseband signal into a medium-high frequency signal. The demodulator is configured to demodulate a received electromagnetic wave signal into a low-frequency baseband signal. Then, the demodulator transmits the low-frequency baseband signal obtained through demodulation to the baseband processor for processing. The low-frequency baseband signal is processed by the baseband processor, and then transmitted to the application processor. The application processor outputs a sound signal by using the audio unit 160, or displays an image or a video by using a display screen in the input/output apparatus 150. In some embodiments, the modem processor may be an independent device. In some other embodiments, the modem processor may be independent of the processor 110, and is disposed in a same device as the radio frequency unit 130 or another functional module.

The wireless communications module 140 may provide a solution, applied to the electronic device 100, to wireless communication including a wireless local area network (WLAN) (for example, a wireless fidelity (Wi-Fi) network), Bluetooth (BT), a global navigation satellite system (GNSS), frequency modulation (FM), near field communication (NFC), an infrared (IR) technology, and the like. The wireless communications module 140 may be one or more devices integrating at least one communications processing module. The wireless communications module 140 receives an electromagnetic wave through the antenna 141, performs frequency modulation and filtering processing on an electromagnetic wave signal, and transmits a processed signal to the processor 110. The wireless communications module 140 may further receive a to-be-sent signal from the processor 110, perform frequency modulation and amplification on the signal, and convert a processed signal into an electromagnetic wave for radiation through the antenna 141.

In some embodiments, the antenna 131 and the radio frequency unit 130 of the electronic device 100 are coupled, and the antenna 141 and the wireless communications module 140 of the electronic device 100 are coupled, so that the electronic device 100 can communicate with a network and another device by using a wireless communications technology. The wireless communication technology may include a global system for mobile communication (GSM), a general packet radio service (GPRS), code division multiple access (CDMA), wideband code division multiple access (WCDMA), time-division code division multiple access (TD-SCDMA), long term evolution (LTE), BT, a GNSS, a WLAN, NFC, FM, an IR technology, and/or the like. The GNSS may include a global positioning system (GPS), a global navigation satellite system (GLONASS), a BeiDou navigation satellite system (BDS), a quasi-zenith satellite system (QZSS), and/or a satellite-based augmentation system (SBAS).

The electronic device 100 may implement an audio function, for example, music playing or recording, by using the audio unit 160, the application processor, and a peripheral (not shown in the figure), for example, a speaker, a receiver, a microphone, or a headset jack.

The audio unit 160 is configured to convert digital audio information into an analog audio signal output, and is also configured to convert an analog audio input into a digital audio signal. The audio unit 160 may be further configured to: code and decode an audio signal. In some embodiments, the audio unit 160 may be disposed in the processor 110, or some functional modules of the audio unit 160 are disposed in the processor 110.

The input/output apparatus 150 includes a user input apparatus and a display apparatus, and is mainly configured to receive data input by a user and output data to the user.

The user input apparatus may be configured to detect a user operation and generate user operation information used to indicate the user operation. By way of example but not limitation, the user input apparatus may include but is not limited to one or more of a physical keyboard, a function key (for example, a volume control key or a power on/off key), a trackball, a mouse, a joystick, a touchscreen or an optical mouse (the optical mouse is a touch-sensitive surface that does not display a visible output, or an extension of a touch-sensitive surface formed by a touchscreen), or the like, for example, a touchscreen, a display screen, or a keyboard.

The display apparatus may be configured to present visual information such as a user interface, an image, or a video. For example, the display apparatus may display information entered by the user or information provided for the user, various menus of the electronic device, and the like. By way of example rather than limitation, the display apparatus may include a display, for example, a liquid crystal display (LCD), an organic light emitting diode (OLED) display, a cathode ray tube display, a holographic imaging display, a projector, or the like. It should be noted that some types of electronic devices may have no input/output apparatus.

The power supply 170 may supply power to each component of the electronic device 100, for example, a battery. The power supply 170 may be logically connected to the processor 110 by using a power supply management system, to implement functions such as charging management, discharging management, and power consumption management by using the power supply management system.

The sensor module 180 is configured to sense measured information, and can convert the sensed information into an electrical signal or information in another required form according to a specific rule for output, to meet requirements such as information transmission, processing, storage, display, recording, and control. The sensor module 180 may include a pressure sensor, an angular velocity sensor (also referred to as a gyroscope), a barometric pressure sensor, a magnetic sensor, an acceleration sensor, a distance sensor, an optical proximity sensor, an ambient optical sensor, a fingerprint sensor, a temperature sensor, a touch sensor, a bone conduction sensor, and the like. The sensor may be configured to reflect a distance value, a light value, a temperature value, a brightness value, a pressure value, and the like, to facilitate a convenient operation in human-computer interaction.

With continuous progress of science and technology, electronic devices such as a smartphone develop rapidly. A most intuitive change for users is an increase of functions and more enhanced performance of electronic devices. Although powerful performance and integration of a processor enable an electronic device such as a smartphone to obtain a stronger computing capability, sensors in the electronic device play an important role in improving user interaction experience.

Among a plurality of sensors in the electronic device, one type of sensors are configured to perform proximity detection, and such sensors may be collectively referred to as a proximity sensor, for example, the distance sensor and the optical proximity sensor mentioned above. The proximity sensor may convey a proximity or a distance level of an object, and the electronic device may trigger a specific action based on the proximity of the object. For example, the electronic device may use the proximity to indicate a radio frequency unit to adapt to instantaneous radio frequency (RF) power to meet a specific absorption rate (SAR) limit and protect a user using the wireless device from potential harmful effects of RF exposure. Specific absorption rate, also known as electromagnetic wave absorption rate, is electromagnetic power absorbed or consumed by human body tissue per unit mass. For another example, when the user places the electronic device near an ear to answer or make a call, a touchscreen of the electronic device may be disabled based on a proximity indication, to avoid an unnecessary action that may be triggered because the user may touch the screen by using the face or the ear. In addition, the electronic device may be kept in a screen-off state based on a proximity indication, to save power.

According to different working principles, the proximity sensor disposed in the electronic device includes an inductance-based sensor, an optical-based sensor, a heat-based sensor, and a capacitance-based sensor. Capacitive proximity sensors have advantages of a simple structure, high sensitivity, good temperature stability, good adaptability, and good dynamic performance, and are widely used in measurement of mechanical parameters such as displacement, vibration, an angle, and acceleration. Embodiments of this application mainly describe a capacitive sensor configured to detect a proximity or a distance level. The capacitive sensor may also be referred to as a capacitive proximity sensor. The following provides detailed description with reference to the accompanying drawings.

FIG. 2 is a schematic diagram of a structure of a capacitive sensor. As shown in FIG. 2, the capacitive sensor 200 includes a sensor pad 210 and a sensor chip (sensor IC) 220, and the sensor pad 210 is electrically connected to the sensor chip 220 by a conducting wire 230. The sensor pad 210 may be a sheet conductor, for example, a metal sheet. The sensor chip 220 includes some logic circuits, and the sensor chip 220 may charge or discharge the sensor pad 210. The sensor pad 210 is configured to sense capacitance of the sensor, for example, sense capacitance or a capacitance change between the sensor pad 210 and a detected object when the detected object approaches. The sensor chip 220 is configured to obtain a capacitance change when the detected object approaches the sensor, that is, the capacitance or the capacitance change between the sensor pad 210 and the detected object that is sensed by the sensor pad 210.

Specifically, when a detected object such as a finger of a user approaches the sensor pad 210, the detected object and the sensor pad 210 form a capacitor, where the detected object is used as one plate of the capacitor, and the sensor pad 210 is used as the other plate of the capacitor. A ratio of the amount of electric charge on a capacitor to an electric potential difference between two plates is defined as capacitance, which is represented by the letter C, that is, $C=Q/U$. Q is the amount of electric charge on each capacitor plate, and U is the electric potential difference between the two plates. The capacitor formed by the detected object and the sensor pad 210 is approximate to a parallel-plate capacitor. Capacitance is $C=\varepsilon S/d$, where $\varepsilon$ is a dielectric constant of a medium between the plates, S is an area of overlap of the plates, and d is a distance between the plates. In a case in which S and E remain unchanged, when a distance between the detected object and the sensor pad 210 changes, for example, when the detected object continuously approaches the sensor pad 210, the capacitance C of the capacitor formed between the detected object and the sensor pad 210 changes. Because $C=Q/U$, when U remains unchanged, and the amount of charge on the capacitor changes, a current is generated. A current generated due to a change of the distance between the detected object and the sensor pad 210 is transmitted to the sensor chip 220 by the conducting wire 230. The sensor chip 220 may obtain a capacitance change between the detected object and the sensor pad 210 based on a generated current change (or a charge/discharge voltage, a voltage change value, or the like), to obtain the distance between the detected object and the sensor pad 210 (or a distance change value). In short, the capacitive sensor 200 may obtain the distance between the detected object and the sensor pad 210 or the distance change value by using the capacitance between the detected object and the sensor pad 210 or a capacitance change value.

A distance that can be detected by the capacitive sensor 200 has a maximum value. When the distance between the detected object and the sensor pad 210 is greater than the maximum value, because a current generated due to a change of the distance between the detected object and the sensor pad 210 is weak. The sensor chip 220 cannot detect the weak current, and therefore cannot detect the distance between the detected object and the sensor pad 210. In other words, only when the distance between the detected object and the sensor pad 210 is less than or equal to the maximum value, the capacitive sensor 200 can detect existence of the detected object, and can detect the distance between the detected object and the sensor pad 210 or a proximity between the detected object and the sensor pad 210. A longer distance that can be detected by the capacitive sensor 200 indicates higher detection sensitivity.

The capacitive sensor may be configured to detect metal and nonmetallic substances, such as paper, liquid, glass, and cloth. The detected object may be an electric conductor, an insulator with a large dielectric loss, or an object containing water (for example, a human body). In addition, the detected object may be grounded, or may not be grounded. This is not specifically limited in embodiments of this application.

It can be learned from the foregoing capacitance calculation formula $C=\varepsilon S/d$ that, in addition to the distance d between the plates (that is, the distance between the detected object and the sensor pad), factors that affect the capacitance also includes the area S of overlap of the plates. If the area of overlap of the plates is small, the maximum distance of the detected object that can be detected by the capacitive sensor is short. Therefore, in order to expand a range of the distance that can be detected by the capacitive sensor, an area of the capacitor plate may be increased. In this way, in the case of same capacitance, a larger area of the capacitor plate allows a longer distance between the plates. In this way, the maximum distance of the detected object that can be detected by the capacitive sensor is increased. A longer detected distance indicates higher sensitivity. Certainly, at a same distance, a larger area of the capacitor plate brings a larger capacitance and a larger generated current. Therefore, detection accuracy of the sensor chip 220 is higher. Because an area of the detected object may be far larger than an area of the sensor pad in the capacitive sensor, the area S of overlap of the capacitor plates in embodiments of this application may be considered as the area of the sensor pad. Using a sensor pad with a large area can expand the range of the distance that the capacitive sensor detects, and improve sensitivity of the capacitive sensor. However, internal space of the electronic device is limited, and the sensor pad of the capacitive sensor needs to be correspondingly designed and placed based on the internal space of the electronic device.

Figure 3:
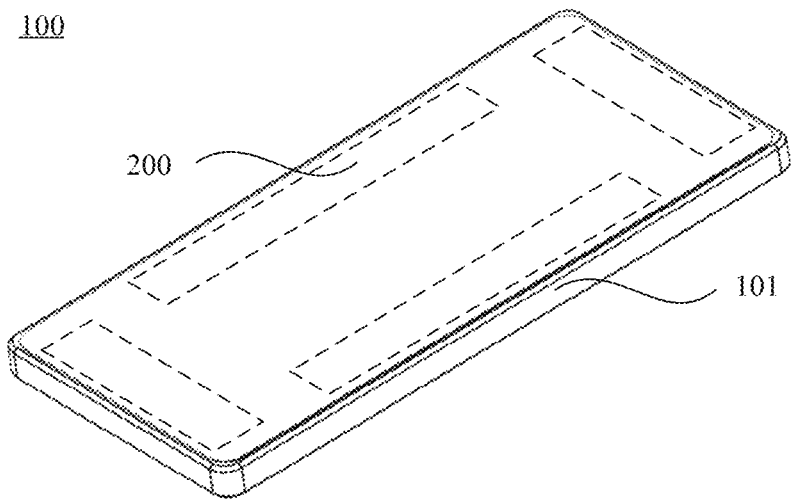
FIG. 3 is a schematic diagram of a structure in which a capacitive sensor is disposed in an electronic device.

FIG. 3 is a schematic diagram of a structure in which a capacitive sensor is disposed in an electronic device. As shown in FIG. 3, an electronic device 100 may include a housing 101 and a plurality of components disposed in accommodation space of the housing 101. The figure shows only an example of a schematic diagram of the outside of the electronic device 100, and the electronic device 100 may include one or more components shown in FIG. 1.

To meet a function requirement of the capacitive sensor 200 for detecting a distance, as shown in FIG. 3, the capacitive sensor 200 is usually disposed at a location in the electronic device 100, close to the housing 101, for example, an area shown by a dashed-line box in FIG. 3. It should be understood that the dashed-line box in the figure is merely used as an example to show an approximate location of the capacitive sensor 200, in the electronic device 100, and does not impose any limitation on a quantity of disposed capacitive sensors 200, a specific structure of the capacitive sensor 200, disposing of another component in the electronic device 100, or the like.

When a capacitive sensor is disposed, one metal sheet alone or a plurality of metal sheets may be disposed as a sensor pad of the capacitive sensor. The sensor pad is configured to sense a capacitance change caused when a detected object approaches the sensor pad, and the capacitance change may be caught by a sensor chip in the capacitive sensor. In this way, a proximity or a distance level of the object is calculated through processing of the sensor chip. It can be learned from the foregoing descriptions that an area of the sensor pad in the capacitive sensor is usually set to be large, so that an object of a long distance can be detected. If one metal sheet alone is disposed as the sensor pad, a large area is also required in the electronic device to place the sensor pad, which is unfavorable to miniaturization of the electronic device.

Therefore, in some solutions, an antenna may be multiplexed, and an existing antenna radiator of the electronic device is used as a sensor pad of the capacitive sensor. That is, the antenna may be used as a radiator for transmitting and receiving an electromagnetic wave, and may also be used as a sensor pad of the capacitive sensor. In an existing solution, when an antenna is used as a sensor pad, a radio frequency path used for communication is connected to a feed (feed) end or a ground (ground) end of a capacitive sensing path used for distance detection. In this way, the radio frequency path and the capacitive sensing path actually share a path, and a lumped component such as a capacitor or an inductor needs to be connected in the circuit for isolation, and then the path is separately connected to the radio frequency path and the sensor path. However, when being transmitted in the same path, a radio frequency signal and a capacitive sensing signal interfere with each other. This is equivalent to that there is a capacitive sensing signal in the radio frequency path, which limits debugging flexibility of the radio frequency path and degrades radio frequency performance; and there is a radio frequency signal in the capacitive sensing path, which affects a detection distance (that is, detection sensitivity) and detection accuracy of the capacitive sensor, and even causes false detection.

Embodiments of this application provide a capacitive sensor. The capacitive sensor provided can improve detection accuracy compared with an existing capacitive sensor. To better understand embodiments of this application, the following first briefly describes related content in this application.

When a conducting wire transmits alternating current, the conducting wire radiates an electromagnetic wave. A radiation capability of the conducting wire is related to a length and a shape of the conducting wire. If two conducting wires are close to each other, the electric field is bound between the two conducting wires and radiation is weak. If the two conducting wires are apart, the electric field is spread in surrounding space and the radiation is enhanced. When the length of the conducting wire is far less than a wavelength of the radiated electromagnetic wave, radiation is weak. When the length of the conducting wire is similar to the wavelength of the radiated electromagnetic wave, a current on the conducting wire increases greatly and the radiation is strong.

An antenna transmits and receives an electromagnetic wave based on the foregoing principle. When an electromagnetic wave is transmitted, a modulated high-frequency oscillation current from a transmitter is sent to an input end of an antenna by using a feeding line. The antenna converts the high-frequency current in a circuit or a pilot wave on a feed transmission line into a space high-frequency electromagnetic wave, and radiates the space high-frequency electromagnetic wave to surrounding space in a form of a wave. After being radiated from the transmit antenna, energy of the electromagnetic wave is propagated forward in all directions of the ground surface. On the contrary, when an electromagnetic wave is received, energy of an intercepted high-frequency electromagnetic wave is converted into energy of a high-frequency current by using a receive antenna, and then is transmitted to a receiver. The antenna may alternatively be a directional antenna. In this way, when transmitting an electromagnetic wave, the antenna effectively converts a high-frequency current in a circuit or a pilot wave on a transmission line into a polarized space electromagnetic wave, and transmits the polarized space electromagnetic wave in a specified direction. When receiving an electromagnetic wave, the antenna effectively converts a specific polarized electromagnetic wave from a specific direction in space into a high-frequency current in a circuit or a pilot wave on a transmission line.

A conducting wire that connects an antenna to an output end of a transmitter (or an input end of a receiver) is referred to as a transmission line or a feeding line. An effective task of the feeding line is to effectively transmit signal energy or radio frequency energy. The feeding line should be able to transmit a signal received by the antenna to the input end of the receiver at minimum loss or transmit a signal sent by the transmitter to an input end of a transmit antenna at minimum loss. In addition, the feeding line cannot obtain or generate a spurious interference signal. A high-frequency current is transmitted in the feeding line, and is also referred to as a radio frequency signal in some embodiments. The radio frequency path described above may be understood as a path on a feeding line.

Polarization of an antenna is determined by polarization of an electromagnetic wave. A polarization direction of the electromagnetic wave is usually described by using a space orientation of an electric field vector of the electromagnetic wave, that is, a depicted trajectory of a change of the space orientation over time of the electric field vector when being observed at a specific location in space and along a propagation direction of the electromagnetic wave. If the trajectory is a straight line, the polarization is known as linear polarization; if the trajectory is a circle, the polarization is known as circular polarization; and if the trajectory is an ellipse, the polarization is known as elliptical polarization. The antenna transmits or receives an electromagnetic wave with specified polarization. For example, a vertically polarized antenna cannot receive a horizontally polarized electromagnetic wave, and vise versa. A left-hand circularly polarized antenna cannot receive a right-hand circularly polarized electromagnetic wave, and vise versa.

If the ground is used as a reference plane, linear polarization is classified into vertical polarization and horizontal polarization. That an electric field vector of an electromagnetic wave is perpendicular to the ground in a maximum radiation direction of the electromagnetic wave is known as vertical polarization. That an electric field vector of an electromagnetic wave is parallel to the ground in a maximum radiation direction of the electromagnetic wave is known as horizontal polarization. Corresponding antennas are known as a vertically polarized antenna and a horizontally polarized antenna. The vertically polarized antenna and the horizontally polarized antenna are also single-polarized antennas. A dual-polarized antenna is formed by combining a vertically polarized antenna and a horizontally polarized antenna, or combining a +45° polarized antenna and a −45° polarized antenna. In a dual-polarized antenna, two antennas are superposed at a fixed angle to transmit two independent waves. Therefore, the dual-polarized antenna has two feeding points.

Any antenna usually works in a specific frequency range and cannot function outside the range. In actual application, a shape, a dimension, a composition material, and the like of the antenna need to be correspondingly designed based on a designed frequency of the antenna (that is, a wavelength of an electromagnetic wave transmitted or received by the antenna). When working at a center frequency (that is, the designed frequency), the antenna can transmit maximum power. When a working frequency deviates from the designed frequency, antenna parameters usually change. When the working frequency changes, a related parameter of the antenna should not exceed a specified range. This frequency range is referred to as a frequency bandwidth, which is briefly referred to as a bandwidth of the antenna.

Based on different structure forms, antennas may be generally classified into two types. One type is a linear antenna formed by a metal conducting wire whose radius is far less than a wavelength, and the other type is a planar antenna formed by a metal or a dielectric surface whose dimension is greater than a wavelength. Linear antennas are mainly used in long, medium, and short wave frequency bands. Various types of linear antennas developed based on symmetric dipoles are used in mobile communications. Planar antennas are mainly used in centimeter or millimeter-wave bands. Most satellite ground stations use parabolic antennas to receive satellite signals.

Different antennas have different attributes. An antenna to be used is determined based on an actual requirement. In general, working efficiency of an antenna is related to a volume of the antenna, and a size of the antenna is related to a wavelength of the antenna. When an antenna is disposed in an electronic device such as a mobile phone, a size, a weight, performance, installation difficulty, and the like of the antenna are all limited. An antenna applied to an electronic device may usually include a monopole antenna, a dipole antenna, a quarter-wave antenna, a microstrip antenna, a patch antenna, a slot antenna, an inverted-F antenna (IFA), a planar inverted-F antenna (PIFA), a ceramic antenna, and the like.

A microstrip antenna has a low profile and low costs, and can be made into a multi-function and conformal antenna. A dimension of the microstrip antenna may be large or small, so that the microstrip antenna may be integrated into a radio device. Favorable to miniaturization and integration, microstrip antennas are widely applied to a handheld portable communications device and an electronic device such as a mobile phone.

A microstrip antenna is a type of antenna in which a specific metal layer is attached to one surface of a thin dielectric plate as a ground plate, the other surface of the thin dielectric plate can be made into a desired shape by patching or etching, and feeding is performed by using a microstrip or a coaxial line. The microstrip antenna has a thin planar structure, and parameters such as a required resonance frequency, polarization, mode, and impedance may be obtained or adjusted by selecting a specific patch shape and feeding manner or by adding a load between a patch and a dielectric substrate.

Figure 4:
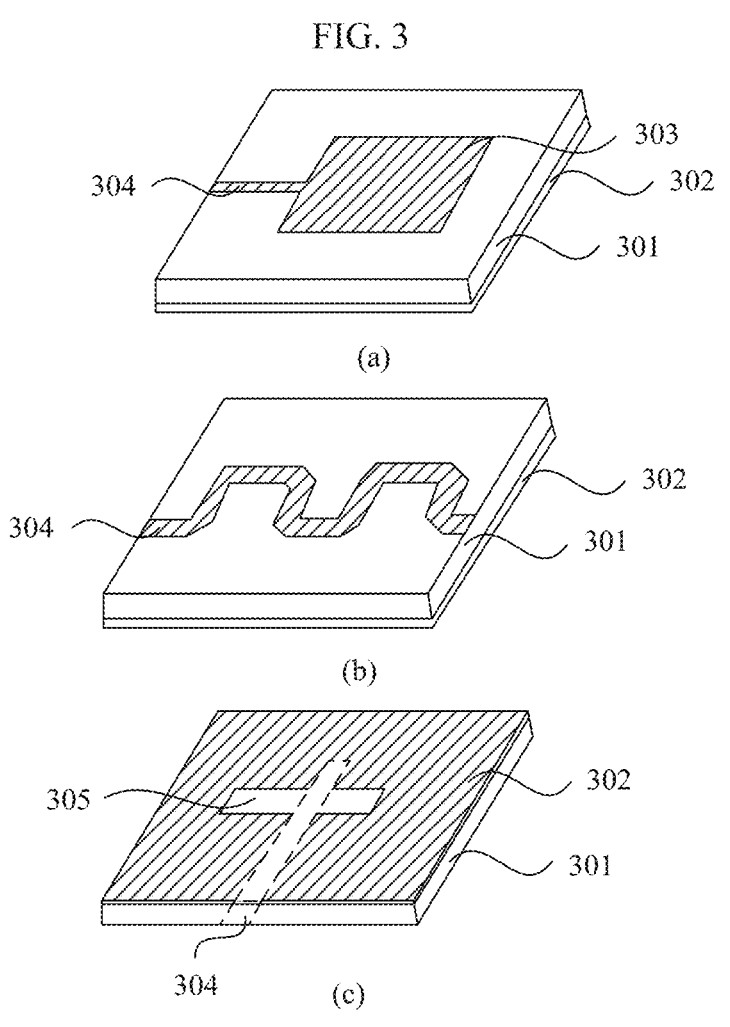
FIG. 4 is a schematic diagram of structural forms of several microstrip antennas.

FIG. 4 is a schematic diagram of structural forms of several microstrip antennas. A microstrip antenna may be roughly classified into a microstrip patch antenna, a microstrip traveling wave antenna, and a microstrip slot antenna according to a form of a radiating element of the microstrip antenna. Refer to (a) in FIG. 4. A microstrip patch antenna (MPA) (also referred to as patch antenna (patch antenna)) is composed of a dielectric substrate 301, a ground plate 302 on one surface of the dielectric substrate 301, and a conductor patch 303 having any planar geometry shape on the other surface of the dielectric substrate 301. Feeding is usually performed by using a microstrip 304 or a coaxial-line feeding line, so that a radio frequency electromagnetic field is excited between the conductor patch 303 and the ground plate 302 and radiates outward through a gap between a periphery of the conductor patch 303 and the ground plate 302. The conductor patch 303 may be a regular-shaped area unit, for example, a square, a circle, a rectangle, an ellipse, a pentagon, a circular ring, a triangle, a semicircle, a notched circle, an ellipse ring, a sector, a semicircle ring, or a sector ring, or may be an irregular abnormal-shaped area unit, for example, an H shape or a corner-cut square. This is not specifically limited in embodiments of this application. Refer to (b) in FIG. 4. A microstrip traveling-wave antenna (MTA) includes a dielectric substrate 301, a ground plate 302 on one surface of the dielectric substrate 301, and a microstrip 304 or a TEM wave transmission line that is in a chain-shaped periodic structure and that is on the other surface of the dielectric substrate 301. The microstrip traveling-wave antenna mainly uses a specific deformation (such as a quarter bend or an arc bend) of the microstrip 304 to generate radiation. Refer to (c) in FIG. 4. A microstrip slot antenna includes a microstrip 304 and a slot 305 opened on a ground plate 302. The microstrip slot antenna may radiate by using the slot 305 opened on the ground plate 302, and in this case, the microstrip slot antenna is fed by the microstrip 304 on another side of the dielectric substrate 301 or another feeding line. The slot 305 may be rectangular (including a wide slot or a narrow slot), circular, or annular.

The microstrip antenna may have a plurality of feeding manners, mainly including microstrip transmission line feeding, coaxial probe feeding, and coupled feeding. In the microstrip feeding manner, a feeding line is also a conductor strip, and usually has a narrow width. During feeding, there may be central microstrip feeding and eccentric microstrip feeding. In the coaxial cable probe feeding manner, an inner conductor of a coaxial cable is connected to a radiation patch, and an outer conductor is connected to the ground. Coupling feeding may further be classified into transmission line coupling feeding and small hole coupling feeding.

In embodiments of this application, an antenna radiator is multiplexed as a sensor pad of a capacitive sensor, and an antenna may be any one of the antennas described above. For ease of description, in an embodiment of this application, a patch antenna is used as an example to describe an implementation solution of a capacitive sensor provided in embodiments of this application. However, it should be understood that the implementation solution of a capacitive sensor provided in embodiments of this application is not limited to being applied to a patch antenna, and may be further applied to any one of the antennas described above.

In other words, an electronic device in this embodiment of this application includes a first antenna unit, the first antenna unit includes a first radiator, and the first radiator is configured to receive and transmit a radio frequency signal. The first radiator is further used as a sensor pad of the capacitive sensor, that is, the first radiator is further configured to sense capacitance or a capacitance change between the first radiator and a detected object when the detected object approaches. The electronic device further includes a sensor chip. The sensor chip is configured to obtain the foregoing capacitance or the foregoing capacitance change, to determine a proximity of the detected object relative to the first radiator, and the sensor chip is electrically connected to a minimum-voltage point on the first radiator by a conducting wire. When the sensor chip determines the proximity of the detected object relative to the first radiator, the sensor chip may determine that the detected object is already close to the first radiator or is approaching the first radiator. For example, when the capacitance or the capacitance change sensed by the first radiator exceeds a minimum detection threshold of the sensor chip, the sensor chip may determine that the detected object is already close to the first radiator, that is, the sensor chip detects the detected object. For another example, when the capacitance or the capacitance change sensed by the first radiator exceeds a preset threshold or is increasing continuously, the sensor chip may determine that the detected object is approaching the first radiator, that is, a distance between the detected object and the first radiator is decreasing continuously. As the proximity of the detected object relative to the first radiator changes, the electronic device may perform some operations based on the proximity of the detected object, for example, switching an antenna module, changing a beam direction, and identifying a user gesture.

It should be understood that a function of a radiator of the antenna unit is to convert a radio frequency signal into an electromagnetic wave and transmit the electromagnetic wave to space, or to receive an electromagnetic wave in space and convert the electromagnetic wave into a radio frequency signal. Therefore, in embodiments of this application, that the radiator of the antenna unit is configured to receive and transmit a radio frequency signal and that the radiator of the antenna unit is configured to receive and transmit an electromagnetic wave may be understood as having a same meaning.

In embodiments of this application, the radiator of the antenna unit is multiplexed as the sensor pad of the capacitive sensor. For ease of understanding, in this embodiment of this application, in description that the radiator is used to sense capacitance or a capacitance change between a detected object and the radiator, the term "sensor pad" is used to distinguish between different functions of the radiator. That is, the term "radiator" is used to describe a function of receiving and transmitting a radio frequency signal by the radiator, and the term "sensor pad" is used to describe a function of sensing capacitance or a capacitance change by the radiator. However, both the term "radiator" and the term "sensor pad" refer to the radiator of the antenna unit.

Figure 5:
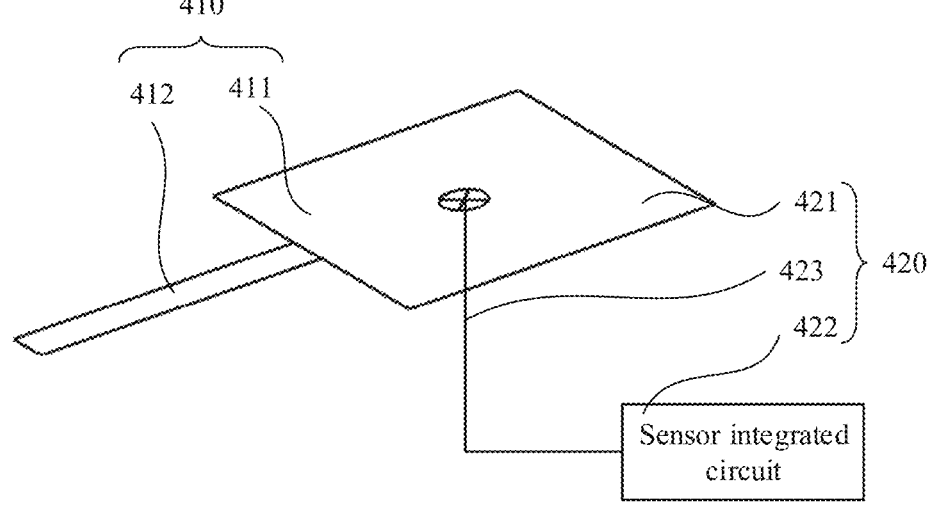
FIG. 5 is a schematic diagram of a structure of a capacitive sensor according to an embodiment of this application.

FIG. 5 is a schematic diagram of a structure of a capacitive sensor according to an embodiment of this application.

As shown in FIG. 5, a capacitive sensor module 420 includes a sensor pad 421 and a sensor chip 422. An antenna unit 410 includes a radiator 411 and a feeding line 412. The sensor pad 421 of the capacitive sensor module 420 multiplexes the radiator 411 of the antenna unit 410, that is, the radiator 411 of the antenna unit is used as the sensor pad 421 of the capacitive sensor. The sensor chip 422 of the capacitive sensor module is conducted (that is, electrically connected) to the radiator 411 of the antenna unit by a conducting wire 423, and a location at which the conducting wire 423 is connected to the radiator 411 is a minimum-voltage point on the radiator 411.

It should be noted that, in embodiments of this application, the "radiator" may also be referred to as a "radiating unit", a "radiator patch", or the like in some other embodiments, and the three terms have a same meaning. In some other embodiments, the "capacitive sensor module" may also be briefly referred to as a "capacitive sensor".

It should be understood that, in some embodiments, the minimum-voltage point on the radiator of the antenna unit may also be a minimum electric field point or a weakest-electric field point, that is, the minimum electric field point on the antenna unit is located on the antenna physical entity.

In this way, it may also be considered that the sensor chip 422 of the capacitive sensor module is conducted to the minimum electric field point on the radiator 411 of the antenna unit by the conducting wire 423.

Direct feeding or coupling feeding may be performed between the feeding line 412 and the radiator 411 of the antenna unit 410. Direct feeding, such as microstrip transmission line feeding and coaxial probe feeding, is that a feeding line is in direct contact with a conductor patch. Coupled feeding, such as electromagnetic coupling, a slot coupling method, and a coplanar waveguide feeding method, is that a feeding line has no direct contact with a conductor patch. A shape and a dimension of the radiator 411 are related to a working mode, a working frequency, a function, and the like of the antenna unit 410. In actual application, a specific structure form of the radiator 411 needs to be correspondingly designed based on parameters of the antenna unit 410.

In the capacitive sensor provided in this embodiment of this application, a radiator of an antenna unit in an electronic device is used as a sensor pad, and a conducting wire is led out from a minimum-voltage point on the radiator and connected to a sensor chip, to form a capacitive sensor system. In this way, a capacitive sensing path of the capacitive sensor can be separated from a radio frequency path of the antenna unit, and a capacitive sensing current of the sensor is transmitted to the sensor from the led-out conducting wire. This reduces or avoids mutual interference between the capacitive sensing path and the radio frequency path, and improves detection accuracy of the capacitive sensor. In addition, because the capacitive sensing path of the capacitive sensor is separated from the radio frequency path of the antenna unit, an isolation component such as a capacitor or an inductor does not need to be disposed to isolate a capacitive sensing signal from a radio frequency signal, so that a structure can be simplified. The radio frequency path does not need to transmit a capacitive sensing current, so that flexibility of debugging the radio frequency path is improved.

Figure 6:
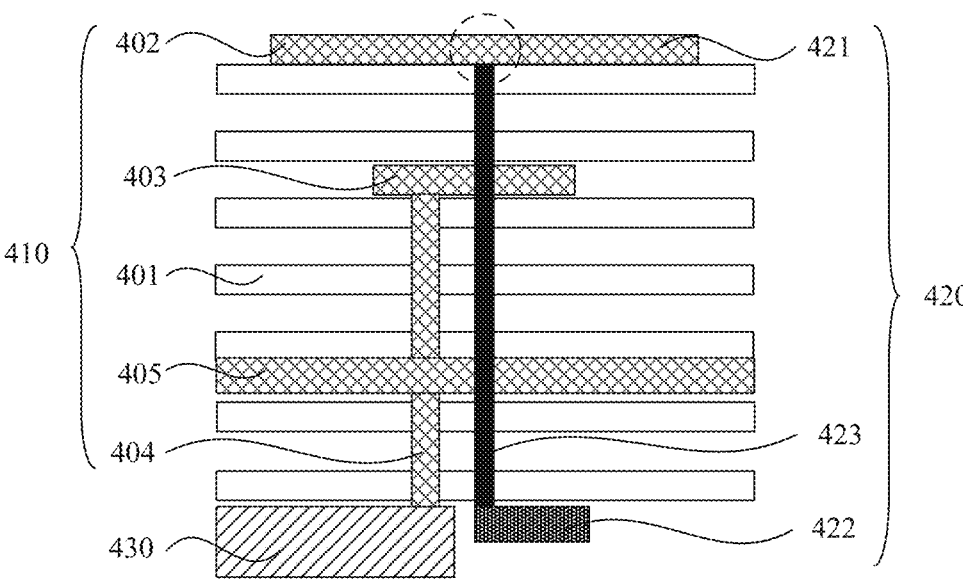
FIG. 6 is a schematic diagram of a cross-sectional structure of a capacitive sensor according to an embodiment of this application.

A patch antenna is used as an example below for detailed description. FIG. 6 is a schematic diagram of a cross-sectional structure of a capacitive sensor according to an embodiment of this application.

FIG. 6 shows an antenna unit 410 and a capacitive sensor module 420 that are included in an electronic device. The antenna unit 410 can effectively radiate an electromagnetic wave to a specific direction in space or can effectively receive an electromagnetic wave from a specific direction in space, to implement conversion between a pilot wave and a free space wave. The antenna unit 410 may be connected to a front-end module (FEM) 430. The front-end module 430 may be configured to complete sending amplification and receiving amplification of a radio frequency signal, or include functions of power detection, control, and a switch. The capacitive sensor module 420 can implement proximity detection, and detect a proximity or a distance level of an object.

In this application, a patch antenna is used as an example. For example, refer to FIG. 6. The antenna unit 410 includes a dielectric substrate 401, a surface layer conductor patch 402, a bottom layer conductor patch 403, a feeding line 404, and the like. In one embodiment, a ground plate 405 is further included. The dielectric substrate 401 includes a plurality of layers, and may serve as a support. The surface layer conductor patch 402, the bottom layer conductor patch 403, and the ground plate 405 are sequentially stacked, and are separated from each other by using the dielectric substrate 401. The feeding line 404 passes through the ground plate 405 and the dielectric substrate 401 to feed the surface layer conductor patch 402 and the bottom layer conductor patch 403. The feeding line 404 is in contact with the bottom layer conductor patch 403, to feed the bottom layer conductor patch 403 in a direct feeding manner. The feeding line 404 is not in direct contact with the surface layer conductor patch 402, to feed the surface layer conductor patch 402 in a coupled feeding manner. Herein, the surface layer conductor patch 402 and the bottom layer conductor patch 403 are radiators of the antenna unit 410. The surface layer conductor patch 402 is a patch closest to a detected object (or a housing of an electronic device), and the bottom layer conductor patch 403 is a patch farthest from the detected object (or the housing of the electronic device).

It should be understood that, when the patch antenna is used as an example, the antenna unit 410 may include a plurality of layers of conductor patches. FIG. 6 shows only two layers of conductor patches (that is, the surface layer conductor patch 402 and the bottom layer conductor patch 403) as an example. In some other embodiments, at least one layer of conductor patch, for example, one layer of conductor patch, two layers of conductor patches, three layers of conductor patches, or more layers of conductor patches, may be alternatively disposed between the surface layer conductor patch 402 and the bottom layer conductor patch 403. Correspondingly, the antenna unit 410 includes three layers of conductor patches, four layers of conductor patches, five layers of conductor patches, or more layers of conductor patches, and the plurality of layers of conductor patches are separated from each other by using a dielectric substrate. In some other embodiments, the antenna unit 410 may alternatively include only one layer of conductor patch, for example, include only the surface layer conductor patch 402 located on the top of the dielectric substrate 401.

In this embodiment of this application, a conductor patch of the antenna unit 410 may be fed in another manner. For example, the feeding line 404 is separated from the bottom layer conductor patch 403 by using a dielectric substrate. In this way, the feeding line 404 feeds all conductor patches in a coupled feeding manner.

When an antenna transmits and receives an electromagnetic wave, an electric field is formed around the antenna, and voltages at different locations on a radiator of the antenna are different. The patch antenna is used as an example. A conductor patch is a radiator of the antenna unit, and an electric field is formed around the surface layer conductor patch 402 and the bottom layer conductor patch 403 in this embodiment of this application. The surface layer conductor patch 402 and the bottom layer conductor patch 403 each have a point with a minimum voltage. If a wire is led out from the point with a minimum voltage on the radiator, there is almost no current in the conducting wire. This is because after the antenna receives an electromagnetic wave and converts the electromagnetic wave into a pilot wave, conduction of the pilot wave is related to electric field distribution of the antenna, and the pilot wave is not transmitted from a place with a minimum voltage (that is, minimum impedance). For the patch antenna, a minimum-voltage point on the conductor patch may be considered as an electric field zero point (or referred to as an electric field weak point). The electric field zero point is a weakest-electric field point on the antenna, and a voltage at this point is minimum. In this way, the pilot wave is transmitted at a location with a stronger electric field, for example, a location of a feeding line, but is not transmitted on the conducting wire led out from the minimum-voltage point.

Therefore, in this embodiment of this application, refer to FIG. 6. The capacitive sensor module 420 includes a sensor pad 421 and a sensor chip 422, and the sensor pad 421 is the radiator of the antenna unit 410. For example, the sensor pad 421 multiplexes the surface layer conductor patch 402 of the antenna unit 410. The sensor pad 421 is connected to the sensor chip 422 by a conducting wire 423, and a location at which the conducting wire 423 is connected to the sensor pad 421 (that is, the surface layer conductor patch 402) is a minimum-voltage point on the surface layer conductor patch 402. In other words, in this embodiment of this application, the conducting wire is led out from the minimum-voltage point on the radiator of the antenna unit and connected to the sensor chip of the capacitive sensor, and the radiator of the antenna unit is used as the sensor pad of the capacitive sensor.

In some other embodiments of this application, the radiator of the antenna unit 410 includes one or more layers of conductor patches, and any layer of conductor patch in the one or more layers of conductor patches may be multiplexed as the sensor pad 421. That is, when the radiator includes one or more layers of conductor patches, the conducting wire is connected to a layer of conductor patch in the one or more layers of conductor patches.

When the radiator of the antenna unit 410 includes a plurality of layers of conductor patches, a conductor patch that is in the plurality of layers of conductor patches and that is closer to the outside of the electronic device (that is, closer to the detected object) may be multiplexed as the sensor pad 421. That is, in the plurality of layers of conductor patches, a conductor patch whose distance from the housing of the electronic device is less than a preset distance may be multiplexed as the sensor pad 421.

When the radiator of the antenna unit 410 includes a plurality of layers of conductor patches, a surface layer conductor patch in the plurality of layers of conductor patches may be multiplexed as the sensor pad 421. Certainly, when the radiator includes one layer of conductor patch, the one layer of conductor patch is a surface layer conductor patch. That is, when the radiator includes one or more layers of conductor patches, the conducting wire is connected to a surface layer conductor patch in the one or more layers of conductor patches.

The conducting wire is separately led out from the radiator of the antenna unit to serve as a current path of the sensor, and a sensor path may be separated from a radio frequency path of the antenna unit, so that mutual interference is avoided. In this embodiment of this application, the surface layer conductor patch of the antenna unit is multiplexed as the sensor pad of the capacitive sensor, and the feeding line of the antenna unit and the surface layer conductor patch implement coupled feeding. In other words, only one conducting wire is led out from the surface layer conductor patch, and the feeding line is not in direct contact with the surface layer conductor patch. Because a radio frequency signal is a high-frequency current, and a capacitive sensing signal is a low-frequency current, a current of the sensor cannot be coupled to the feeding line, and is not transmitted on the radio frequency path, but is transmitted to the sensor chip only on the conducting wire led out from the surface layer conductor patch. For a radio frequency signal, when the antenna unit receives an electromagnetic wave, the antenna unit converts the received electromagnetic wave into a high-frequency current. A trend of the high-frequency current is related to electric field distribution of the radiator. The minimum-voltage point is a maximum current point. Because impedance is voltage/current, the minimum-voltage point is also a minimum impedance point. For example, at a location of an electric field zero point, impedance of the electric field zero point is voltage/current=0. Therefore, the radio frequency signal is not transmitted on the conducting wire led out from a minimum-voltage point (for example, an electric field zero point) of the surface layer conductor patch, but is transmitted on the feeding line in a coupled manner. In addition, in this embodiment of this application, the conducting wire led out from the minimum-voltage point on the radiator of the antenna (for example, the electric field zero point on the patch antenna) is a metal wire that presents high resistance to a radio frequency band. In this way, a high-frequency pilot wave corresponding to an electromagnetic wave is not transmitted on the conducting wire to the sensor chip.

In the foregoing implementation, the sensor path can be separated from the radio frequency path, so that mutual interference is avoided, detection accuracy of the capacitive sensor is improved, and flexibility of debugging the radio frequency path is improved. In addition, an inductor or a capacitor does not need to be disposed to perform filtering isolation, so that a structure design can be simplified. When the antenna unit is the patch antenna, the surface layer conductor patch is used as the sensor pad of the capacitive sensor, so that impact of another conductor patch of the antenna unit can be reduced. In addition, the surface layer conductor patch is closest to the detected object, so that a sensing effect is optimum, a distance that can be detected is farthest, and detection sensitivity of the capacitive sensor can be improved. Based on an existing antenna unit that is not provided with a shared path, the conducting wire is separately led out from the minimum-voltage point or the weakest-electric field point (for example, the electric field zero point) on the radiator. This does not affect performance of the antenna.

In this embodiment of this application, a location of the minimum-voltage point on the radiator of the antenna unit is related to a working mode of the antenna unit, and a shape of the antenna is determined based on the working mode of the antenna. Therefore, it may also be considered that the location of the minimum-voltage point on the radiator of the antenna is related to the shape of the antenna.

Figure 7:
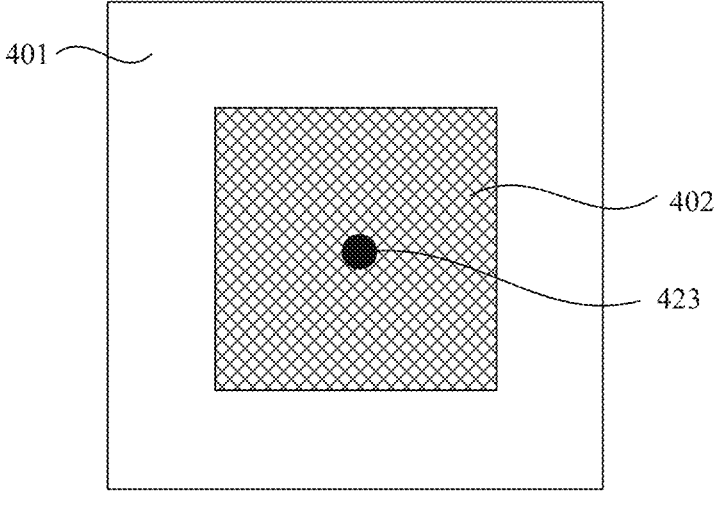
FIG. 7 is a schematic top view of the capacitive sensor in FIG. 6.

When the antenna unit is the patch antenna, a shape of the patch antenna may be a regular pattern or an abnormal-shaped pattern. For example, the shape of the patch antenna may be a regular shape such as a square, a rectangle, a circle, an ellipse, or an H shape. If the working mode of the antenna unit is a half-wavelength mode, the conductor patch is usually a symmetrical pattern, and a symmetrical center (that is, a center of the radiator) of the conductor patch is the electric field zero point, that is, the minimum-voltage point. Therefore, in this case, the conducting wire of the capacitive sensor may be directly led out from the center of the conductor patch. FIG. 7 is a schematic top view of the capacitive sensor in FIG. 6. As shown in FIG. 7, the surface layer conductor patch 402 is of a square shape, and the conducting wire 423 of the capacitive sensor is led out from a center of the surface layer conductor patch 402.

It should be understood that when a shape of the conductor patch is an irregular shape, the minimum-voltage point on the conductor patch needs to be correspondingly determined based on electric field distribution of the conductor patch. For example, the minimum-voltage point on the radiator of the antenna unit may be determined through simulation.

Figure 8:
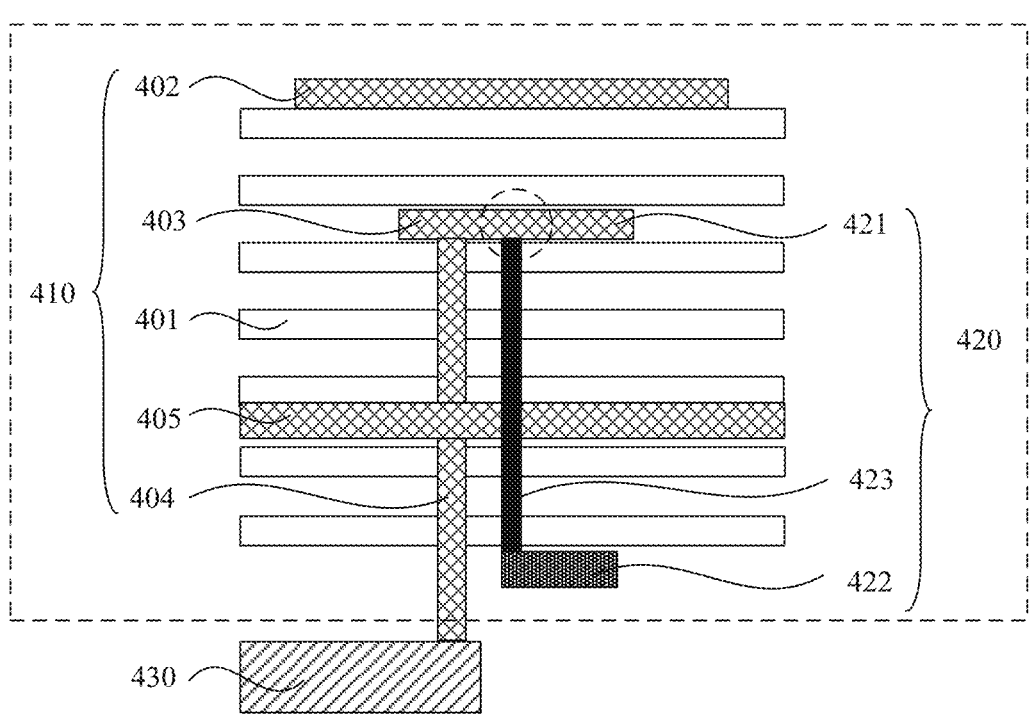
FIG. 8 is a schematic diagram of a cross-sectional structure of another capacitive sensor according to an embodiment of this application.

FIG. 8 is a schematic diagram of a cross-sectional structure of another capacitive sensor according to an embodiment of this application. Different from the capacitive sensor shown in FIG. 6, a capacitive sensor 420 uses a bottom layer conductor patch 403 of an antenna unit 410 as a sensor pad 421. In this way, a conducting wire 423 used to conduct a sensor current is led out from a minimum-voltage point on the bottom layer conductor patch 403 and is connected to a sensor chip 422.

In this case, the bottom layer conductor patch of the antenna unit is multiplexed as the sensor pad of the capacitive sensor, a feeding line feeds the bottom layer conductor patch in a direct feeding manner, and the conducting wire is led out from the bottom layer conductor patch. In this way, both the feeding line of the antenna unit and the conducting wire of the capacitive sensor module are connected to the same conductor patch. As described above, for a radio frequency signal, when the antenna unit receives an electromagnetic wave, the antenna unit converts the received electromagnetic wave into a high-frequency current. A trend of the high-frequency current is related to electric field distribution of the radiator. The high-frequency current is not transmitted on the conducting wire led out from the minimum-voltage point on the bottom layer conductor patch, but is transmitted on the feeding line. In addition, the conducting wire is a metal wire that presents high resistance to a radio frequency band. In this way, a high-frequency pilot wave corresponding to an electromagnetic wave is not transmitted on the conducting wire to the sensor chip. On one hand, a pilot wave on the antenna unit is not transmitted on the conducting wire of the sensor, and a radio frequency current does not interfere with a capacitive sensing current. This helps improve detection accuracy of the capacitive sensor module.

On the other hand, after the conducting wire is separately led out to transmit a capacitive sensing current, the capacitive sensing current may be transmitted only on a conducting wire path, or may be transmitted on the conducting wire path and a feeding line path. However, as long as a capacitive sensing current is transmitted on the conducting wire path to the sensor chip, the sensor chip can detect a distance change based on a current change, to obtain a distance between the detected object and the sensor pad. In addition, because a capacitive sensing path is separated from a radio frequency path, flexibility of debugging the radio frequency path can be improved.

Figure 9:
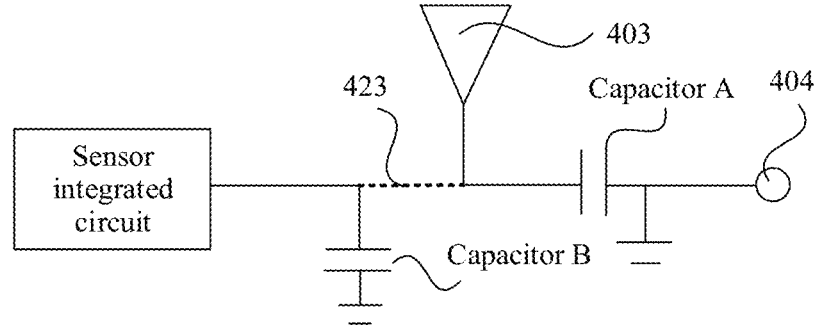
FIG. 9 is a schematic diagram of a circuit of a capacitive sensor according to an embodiment of this application.

When a capacitive sensing current of the sensor is transmitted on the radio frequency path, to avoid possible interference of the capacitive sensing current of the sensor to a radio frequency circuit, a high-pass circuit may be disposed on the radio frequency path, so that the capacitive sensing current of the sensor returns to the ground after passing through the high-pass circuit. FIG. 9 is a schematic diagram of a circuit existing when the capacitive sensor performs proximity detection.

As shown in FIG. 9, when a distance between the bottom layer conductor patch 403 and the detected object changes, the bottom layer conductor patch 403, as the sensor pad of the capacitive sensor, generates a capacitive sensing current. In addition to being transmitted on the conducting wire 423 shown on the left side and reaching the sensor chip, the capacitive sensing current may also be transmitted in the radio frequency path shown on the right side. To avoid interference of the capacitive sensing current of the sensor to a radio frequency circuit, a second high-pass filter circuit, that is, an equivalent capacitor A shown in the figure, is disposed in the radio frequency path, and is configured to block a low-frequency signal of the capacitive sensor module. A large inductor that is grounded is connected behind the second high-pass filter circuit. In this way, a high-frequency radio frequency current can continue to be transmitted on the feeding line after passing through the second high-pass filter circuit, and a capacitive sensing current signal of the sensor returns to the ground after passing through the second high-pass filter circuit, and does not affect the back-end radio frequency circuit. Because the sensor chip also transmits a current to the antenna, the second high-pass filter circuit disposed in the radio frequency path in this embodiment of this application may enable a current signal transmitted by the sensor chip not to directly return to the ground. In this way, the current signal transmitted by the sensor chip can reach the antenna (that is, the sensor pad), to measure a potential difference between a peripheral circuit and the ground, so that the capacitive sensor can work normally.

That is, when the antenna unit (which may be the first antenna unit described above) is the patch antenna, and the feeding line of the antenna unit and the conducting wire of the capacitive sensor are connected to the same conductor patch, the second high-pass filter circuit is connected in series to the radio frequency path of the antenna unit, and is configured to block a low-frequency signal corresponding to capacitance or a capacitance change sensed by the sensor pad (that is, a radiator).

It should be understood that when the solution in this embodiment of this application is applied to another type of antenna unit, for example, a monopole antenna or a dipole antenna, if a feeding manner of the antenna unit is direct feeding, a second high-pass filter circuit may be connected in series to a radio frequency path of the antenna unit, and is configured to block a low-frequency signal corresponding to capacitance or a capacitance change sensed by a sensor pad (that is, the radiator).

The second high-pass filter circuit in this embodiment of this application may be a capacitor circuit.

In this embodiment of this application, the conducting wire 423 may be a low-pass high-resistance wire, so that an inductor sensor signal can pass through, and a radio frequency signal can be filtered out. In one embodiment, a first high-pass filter circuit may be further disposed in the sensor path of the capacitive sensor module, and is configured to filter out a radio frequency signal of the antenna unit. That is, the first high-pass filter circuit may be disposed on a path between the radiator and the sensor chip, to filter out a radio frequency signal. For example, as shown in FIG. 9, an equivalent capacitor B is disposed on the sensor path and then grounded, to assist in filtering out the radio frequency signal.

In the foregoing embodiment, descriptions are provided by using an example in which the surface layer conductor patch and the bottom layer conductor patch each are multiplexed as the sensor pad. In another embodiment of this application, a plurality of intermediate conductor patches may be further disposed between the surface layer conductor patch and the bottom layer conductor patch in the antenna unit. Any one of the plurality of intermediate conductor patches may be multiplexed as a sensor pad. When the intermediate conductor patch is used as a sensor pad, in a direct feeding manner, a feeding line and a conducting wire of the capacitive sensor may be led out from a same conductor patch, or may be led out from different conductor patches. In a coupled feeding manner, only a conducting wire of the capacitive sensor is led out from a conductor patch, transmission paths of a radio frequency current and a sensor current are similar to the foregoing transmission paths. For brevity, details are not described again.

It should be further understood that, when another conductor patch (that is, a patch other than the surface layer conductor patch and the bottom layer conductor patch) of the patch antenna is selected, or a radiator of an antenna in another structure form is selected as a sensor pad of the capacitive sensor, a leading-out manner of a conducting wire and a transmission path of a capacitive sensing current are respectively similar to the leading-out manner and the transmission path in FIG. 6 or FIG. 8. For details, refer to the foregoing descriptions. The details are not described herein again.

Figure 10:
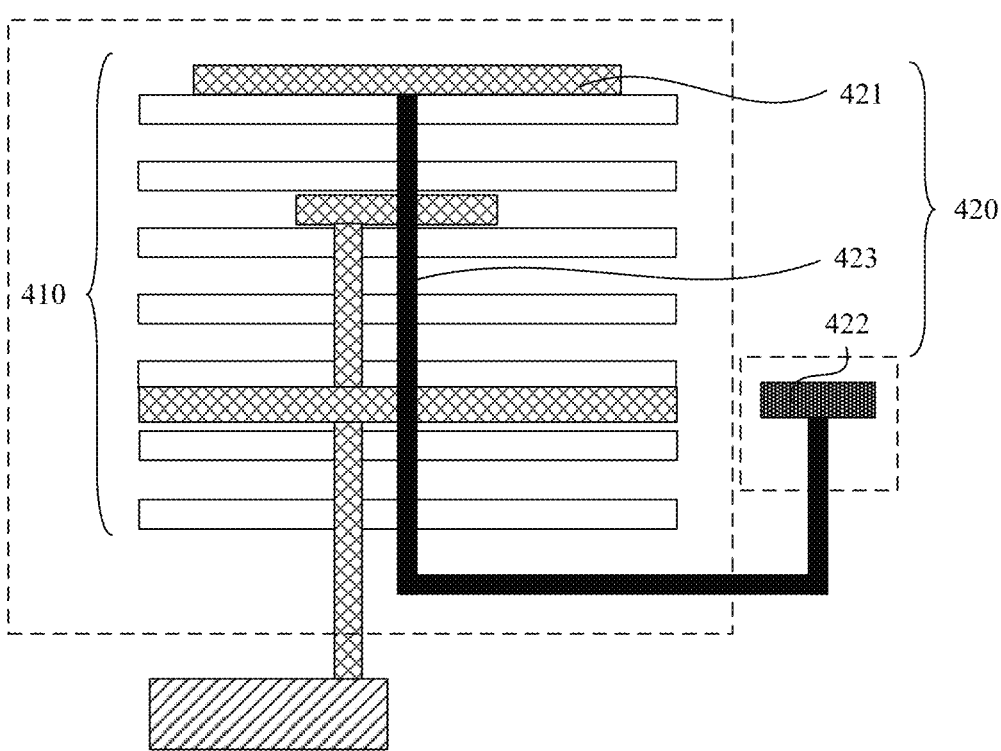
FIG. 10 is a schematic diagram of a cross-sectional structure of still another capacitive sensor according to an embodiment of this application.

In this embodiment of this application, because the radiator of the antenna is multiplexed as the sensor pad of the capacitive sensor, the antenna unit and the capacitive sensor module may be packaged together. To be specific, the antenna unit and the sensor chip may be packaged together. For example, as shown in a dashed box in FIG. 8, the antenna unit 410 and the sensor chip 422 are packaged as a whole. In some other embodiments, a part of the capacitive sensor module may be packaged together with the antenna unit. To be specific, the capacitive sensor module is packaged into two parts. As shown in FIG. 10, the sensor pad 421 (that is, the antenna radiator) and the conducting wire 423 in the capacitive sensor 420 are packaged together with the antenna unit 410, and the sensor chip 422 in the capacitive sensor 420 is independently packaged.

Figures 11, 12:
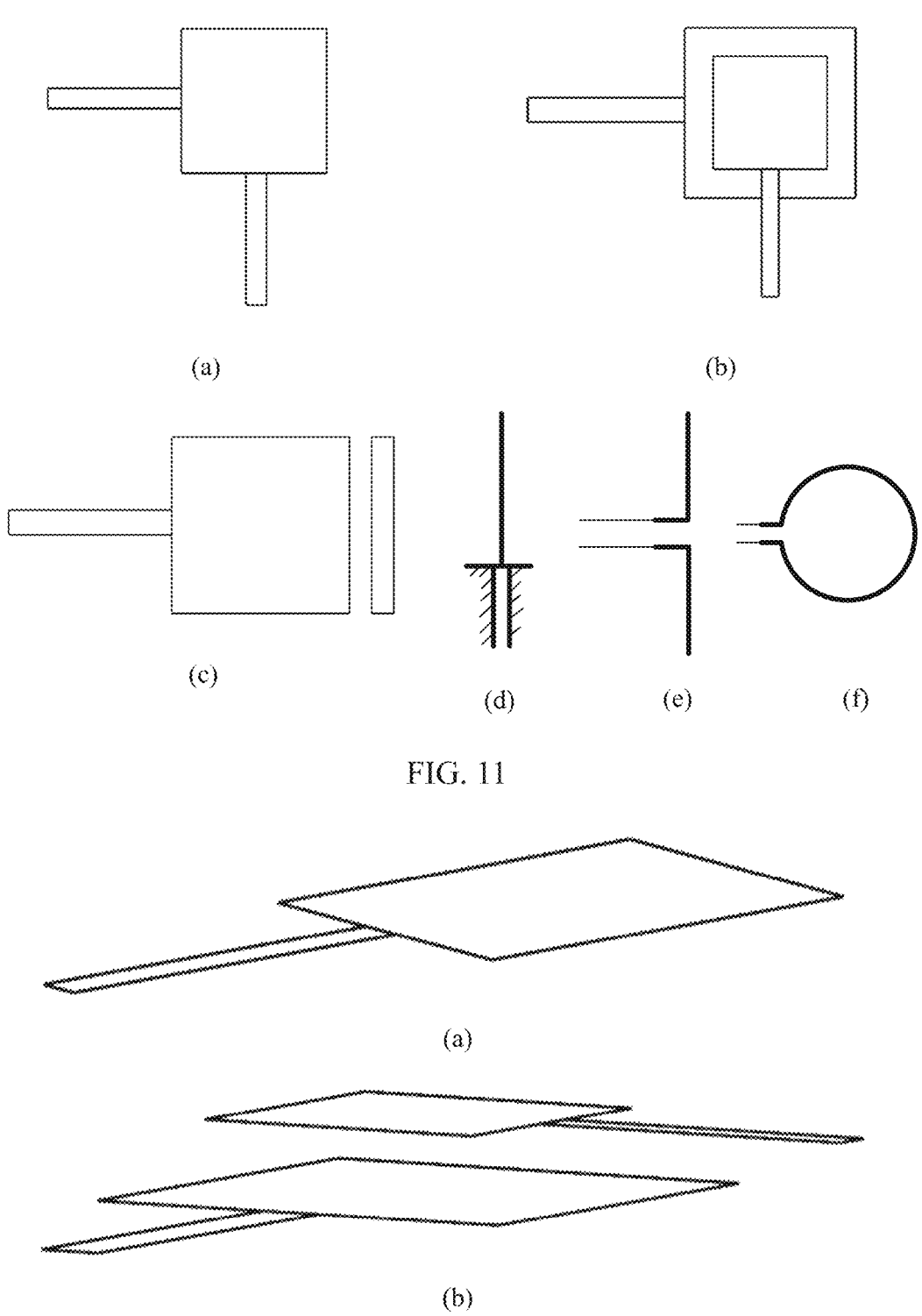
FIG. 11 is a schematic diagram of a structural form of an antenna unit according to an embodiment of this application.
FIG. 12 is a schematic diagram of a structural form of an antenna unit according to an embodiment of this application.

In embodiments of this application, the antenna unit multiplexed as the sensor pad of the capacitive sensor may be an antenna in any structure form having a stable minimum-voltage point (for example, a voltage zero point or an electric field zero point), and a polarization direction of the antenna unit, a quantity of patch layers, and a quantity of antenna units are not specially limited in embodiments of this application. For example, the antenna unit may be, for example, the single-polarized antennas shown in FIG. 6 to FIG. 10, or may be, for example, dual-polarized antennas shown in (a) and (b) in FIG. 11, or may be, for example, an antenna with a parasitic stub shown in (c) in FIG. 11. Alternatively, the antenna unit may be linear antennas shown in (e) and (f) in FIG. 11, for example, a monopole antenna, a dipole antenna, and a loop antenna. It should be understood that the antenna unit in embodiments of this application may alternatively be an antenna added with a director, a surface antenna, a microstrip antenna, a resonant antenna in another structure form, or the like. Details are not described herein. When the antenna unit is an antenna of the foregoing structure, a minimum-voltage point on a radiator of the antenna unit may be determined based on a specific shape of the antenna, a working mode of the antenna, a parameter of the antenna, and the like.

When the antenna unit in embodiments of this application is a patch antenna, a quantity of conductor patch layers of the patch antenna is not limited. The antenna unit may be a single-layer patch antenna shown in (a) in FIG. 12, or may be a double-layer patch antenna shown in (b) in FIG. 12. Alternatively, the patch antenna may be a multi-layer patch antenna, for example, a three-layer patch antenna, a four-layer patch antenna, or the like, which is not described herein. When the radiator includes one or more layers of conductor patches, any layer of conductor patch in the one or more layers of conductor patches may be multiplexed as the sensor pad of the capacitive sensor.

It should be understood that in embodiments of this application, different polarization directions and different layers of conductor patches may be combined to form different patch antennas, for example, a single-layer single-polarized patch antenna, a single-layer dual-polarized patch antenna, or a dual-layer dual-polarized patch antenna.

In embodiments of this application, no specific limitation is imposed on a quantity of antenna units configured to be multiplexed as a sensor pad of a capacitive sensor. A radiator of a single antenna unit may be multiplexed as a sensor pad of a capacitive sensor, a radiator of an antenna array (that is, including a plurality of antenna units) may be multiplexed as a sensor pad of a capacitive sensor, or radiators of a plurality of antenna arrays may be multiplexed as sensor pads of a capacitive sensor.

In other words, the electronic device in embodiments of this application further includes a second antenna unit, the second antenna unit includes a second radiator, and a minimum-voltage point on the second radiator is electrically connected to the sensor chip by a conducting wire. The first antenna unit and the second antenna unit may belong to a same antenna array, or may belong to different antenna arrays. The conducting wire connected to the first radiator of the first antenna unit and the conducting wire connected to the second radiator of the second antenna unit are combined into one path or a plurality of paths that are connected to the sensor chip.

It should be understood that the electronic device in embodiments of this application is not limited to including the first antenna unit and the second antenna unit, and may further include more antenna units. Radiators of these antenna units may all be used as sensor pads to sense capacitance or capacitance changes between the radiators and the detected object.

Figures 13, 14:
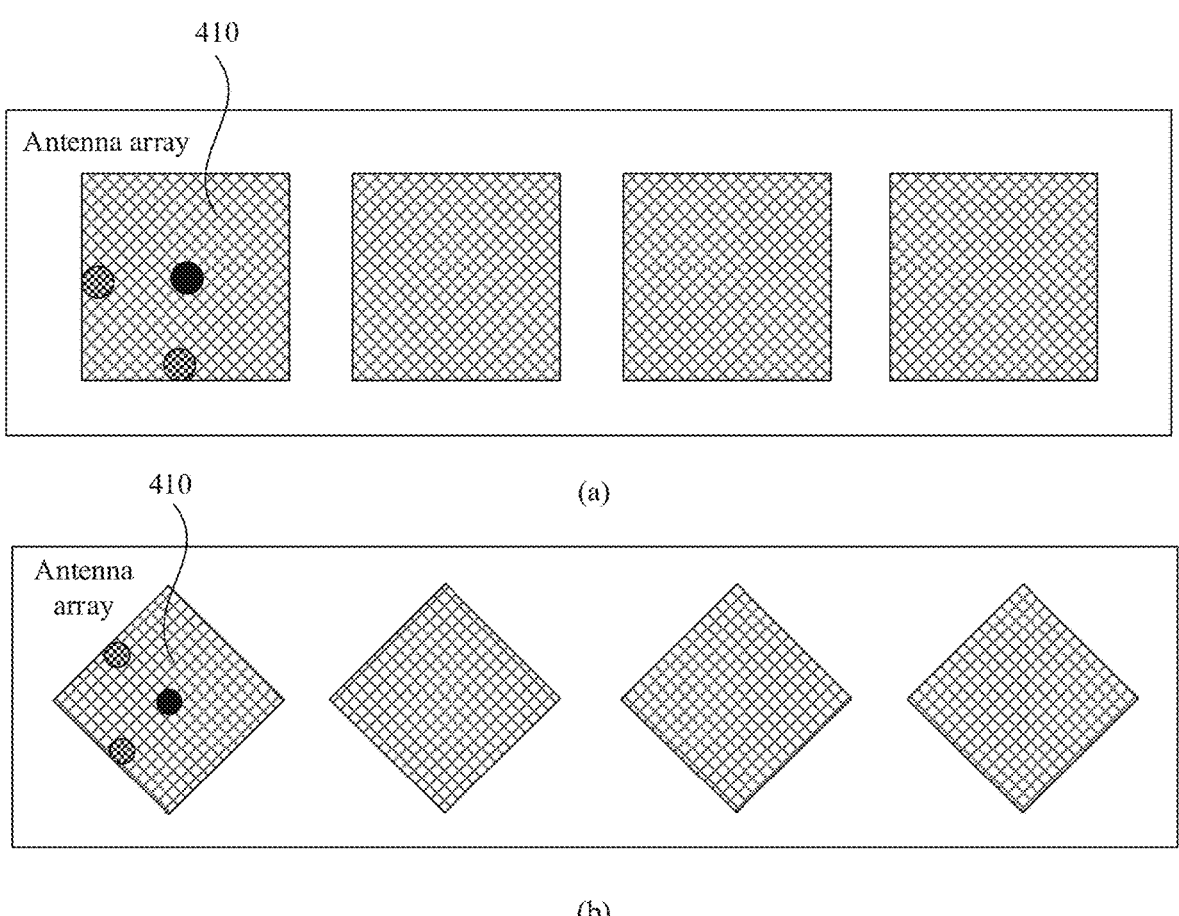
FIG. 13 is a schematic top view of an antenna array according to an embodiment of this application.
FIG. 14 is a schematic diagram of a structure of a capacitive sensor according to an embodiment of this application.

FIG. 13 is a schematic top view of an antenna array according to an embodiment of this application. As shown in (a) and (b) in FIG. 13, the antenna array includes a plurality of antenna units 410. The antenna unit 410 may be a horizontal/vertical polarized antenna shown in (a), or may be a ±45° polarized antenna shown in (b). One black dot in the middle of the antenna unit 410 indicates a lead-out location of a conducting wire of a capacitive sensor, and the other two dots on the antenna unit 410 indicate feed points. It should be understood that the antenna array may alternatively be formed by an antenna unit in another structure form, for example, any antenna structure shown in FIG. 11 or FIG. 12.

When the sensor pad of the capacitive sensor multiplexes an antenna unit in the antenna array, radiators of some antenna units in the antenna array may be selected as sensor pads, or radiators of all antenna units in the antenna array may be used as sensor pads.

In one embodiment, the antenna array includes a plurality of antenna units. When sensor pads of the capacitive sensor are radiators of the plurality of antenna units in the antenna array, conducting wires used to transmit capacitive sensing currents may be respectively led out from the radiators of the plurality of antenna units, and the plurality of conducting wires are finally combined into one path that are connected to a sensor chip of one capacitive sensor.

For example, as shown in FIG. 14, an antenna array includes antenna units 410a, 410b, 410c, and 410d, and conducting wires are respectively led out from radiators of the four antenna units. The four antenna units 410a, 410b, 410c, and 410d are connected in parallel. Finally, conducting wires connected to the radiators of the four antenna units are combined into one path, and then are connected to one sensor chip. A capacitive sensing signal processed by the sensor chip is a sum of current signals sensed by the radiators of the four antenna units. It should be understood that a capacitive sensing signal in embodiments of this application is a current signal.

The sensor pads of the capacitive sensor are the radiators of the plurality of antenna units, and an area of the sensor pads is increased, so that a capacitive sensing current can be increased, and detection accuracy of the sensor chip is improved. Further, compared with using a radiator of a single antenna unit as a sensor pad, using the radiators of the plurality of antenna units can increase a detection distance of the capacitive sensor and improve detection sensitivity of the capacitive sensor. That is, when a detected object is far away from the sensor pad, a current can be generated in the sensor pad, so that the current is detect by the sensor chip.

In one embodiment, the antenna array includes a plurality of antenna units. When sensor pads of the capacitive sensor are radiators of the plurality of antenna units in the antenna array, conducting wires used to transmit capacitive sensing currents may be respectively led out from the radiators of the plurality of antenna units. Conducting wires corresponding to some antenna units are combined into one path and then are connected to the sensor chip, and conducting wires corresponding to the other antenna units are combined into another path and then are connected to the same sensor chip.

Figure 15:
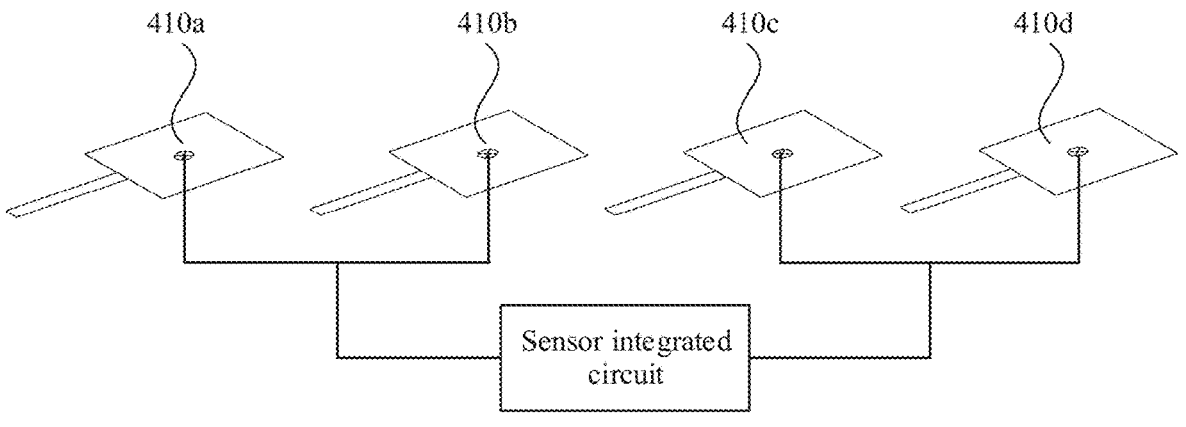
FIG. 15 is a schematic diagram of a structure of another capacitive sensor according to an embodiment of this application.

For example, as shown in FIG. 15, an antenna array includes antenna units 410*a*, 410*b*, 410*c*, and 410*d*, and conducting wires are respectively led out from radiators of the four antenna units. The four antenna units 410*a*, 410*b*, 410*c*, and 410*d* are connected in parallel. Conducting wires connected to radiators of the antenna units 410*a* and 410*b* are combined into one path and then are connected to a sensor chip, and conducting wires connected to radiators of the antenna units 410*c* and 410*d* are combined into one path and then are connected to the same sensor chip. In other words, the conducting wires connected to the radiators of the plurality of antenna units are connected to the sensor chip on a plurality of paths. Capacitive sensing signals processed by the sensor chip are capacitive sensing signals on a plurality of paths. For example, the sensor chip has a function of processing information on a plurality of paths, and the sensor chip may independently process a capacitive sensing signal entering in each path.

The sensor pads of the capacitive sensor are the radiators of the plurality of antenna units, and an area of the sensor pads is increased, so that a capacitive sensing current can be increased, and detection accuracy of the sensor chip is improved. Multiplexing the radiators of the plurality of antenna units can increase a detection distance of the capacitive sensor and improve detection sensitivity of the capacitive sensor. Further, because the radiators (that is, a plurality of sensor pads) of the plurality of antenna units are connected to the sensor chip on a plurality of paths, the sensor chip may calculate a plurality of distances between a detected object and the sensor pads or distances between a plurality of detected objects and the sensor pads based on a plurality of paths of capacitive sensing currents. Therefore, a precise location of the detected object can be obtained.

In still another embodiment, the antenna array includes a plurality of antenna units. When sensor pads of the capacitive sensor are radiators of the plurality of antenna units in the antenna array, conducting wires used to transmit capacitive sensing currents may be respectively led out from the radiators of the plurality of antenna units, and the conducting wires corresponding to the plurality of antenna units are separately connected to a same sensor chip.

Figure 16:
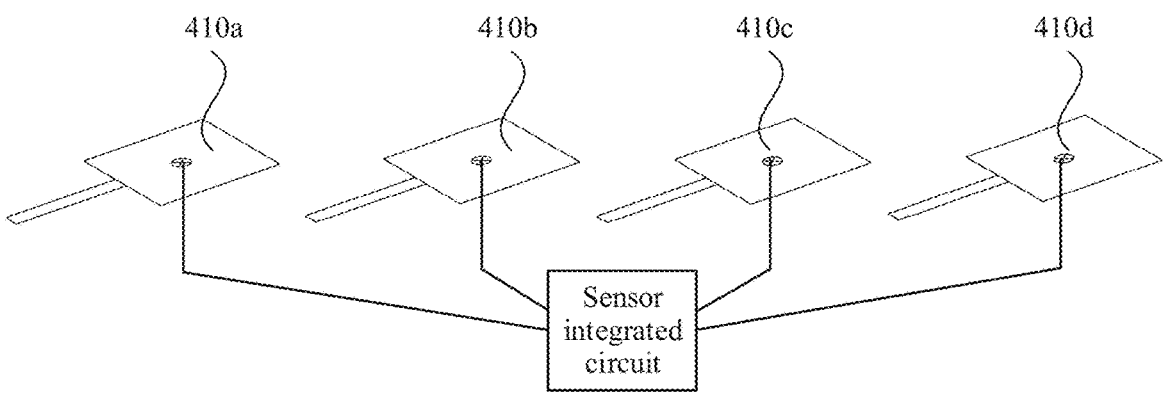
FIG. 16 is a schematic diagram of a structure of another capacitive sensor according to an embodiment of this application.

For example, as shown in FIG. 16, an antenna array includes antenna units 410*a*, 410*b*, 410*c*, and 410*d*, and conducting wires are respectively led out from radiators of the four antenna units. The radiators of the four antenna units 410*a*, 410*b*, 410*c*, and 410*d* are connected in parallel, and the conducting wires led out from the radiators of the four antenna units 410*a*, 410*b*, 410*c*, and 410*d* are separately connected to a same sensor chip. Capacitive sensing signals processed by the sensor chip are capacitive sensing signals on four paths, and the sensor chip may independently process a capacitive sensing signal entering in each path.

The sensor pads of the capacitive sensor multiplex the radiators of the plurality of antenna units, and an area of the sensor pads is increased, so that a capacitive sensing current can be increased, and detection accuracy of the sensor chip is improved. Multiplexing the radiators of the plurality of antenna units can increase a detection distance of the capacitive sensor and improve detection sensitivity of the capacitive sensor. Further, a radiator of each antenna unit is connected to the sensor chip. In this way, a current sensed by the radiator of each antenna unit is separately transmitted to the sensor chip, and the sensor chip may calculate a distance between a detected object and the sensor pad based on the capacitive sensing current on each path, so that a more precise location of the detected object can be obtained.

In still another embodiment, the antenna array includes a plurality of antenna units. When sensor pads of the capacitive sensor are radiators of the plurality of antenna units in the antenna array, a conducting wire may be led out from a radiator of each antenna unit and connected to a sensor chip corresponding to the radiator. In other words, a radiator of each of the plurality of antenna units in the antenna array corresponds to one sensor chip.

Figure 17:
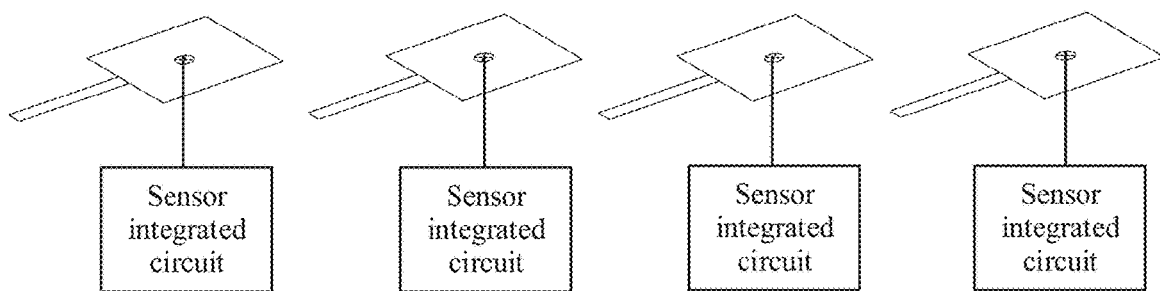
FIG. 17 is a schematic diagram of a structure of still another capacitive sensor according to an embodiment of this application.

For example, as shown in FIG. 17, an antenna array includes antenna units 410*a*, 410*b*, 410*c*, and 410*d*, and conducting wires are respectively led out from radiators of the four antenna units. A conducting wire of each antenna unit is connected to one sensor chip.

Certainly, sensor pads of the capacitive sensor may alternatively multiplex antenna units in a plurality of antenna arrays. For example, radiators of some antenna units in the plurality of antenna arrays may be selected as sensor pads, or radiators of all antenna units in the plurality of antenna arrays may be used as sensor pads.

In one embodiment, capacitive sensing paths of a plurality of antenna arrays may be combined into one path and connected to the sensor chip, or may be combined into a plurality of paths and connected to the sensor chip, or each of the capacitive sensing paths may be separately connected to the sensor chip.

Figures 18, 19:
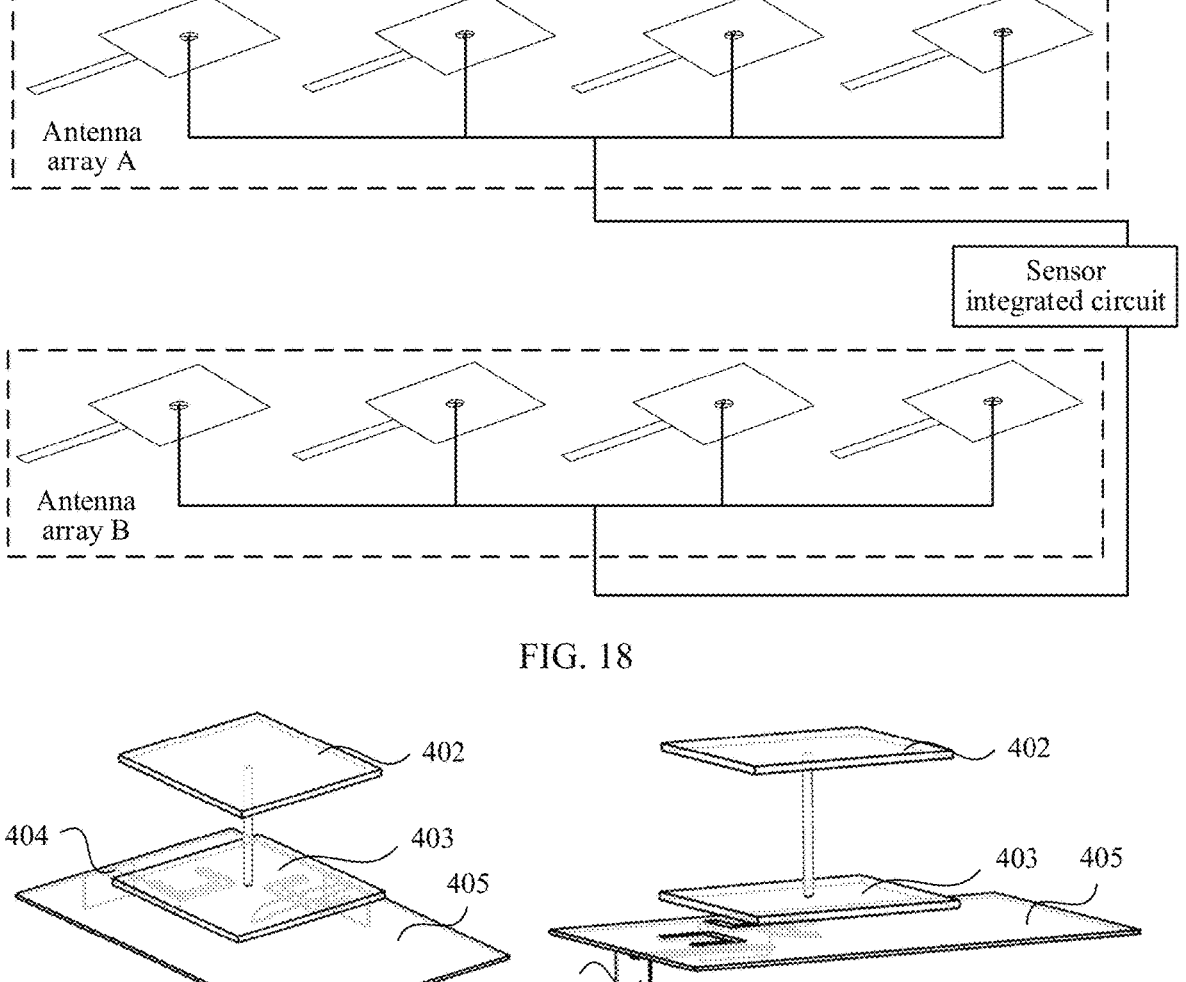
FIG. 18 is a schematic diagram of a structure of yet another capacitive sensor according to an embodiment of this application.
FIG. 19 is a schematic diagram of a structure of still yet another capacitive sensor according to an embodiment of this application.

For example, as shown in FIG. 18, sensor pads of a capacitive sensor multiplex radiators of antenna units in two antenna arrays (that is, an antenna array A and an antenna array B), and conducting wires are separately led out from radiators of a plurality of antenna units in each antenna array. The conducting wires of the radiators of the antenna units in the antenna array A are combined into one path and then connected to a sensor chip, and the conducting wires of the radiators of the antenna units in the antenna array B are combined into one path and then connected to the sensor chip.

It should be understood that, when the antenna array described above includes a patch antenna in a half-wavelength mode, the conducting wire of the capacitive sensor may be directly led out from a center of the conductor patch.

It should be further understood that, for a plurality of antenna units in a same antenna array, conducting wires led out from radiators of the plurality of antenna units may be connected, and performance of an antenna is not affected. Feeding lines of the plurality of antenna units may also be connected. However, for a plurality of antenna arrays, conducting wires led out from radiators of antenna units in different antenna arrays may be connected, but feeding lines of antenna units in different antenna arrays are usually not connected.

In the foregoing descriptions, the feeding line of the antenna unit is directly connected to the radiator, to apply a direct feeding manner. In embodiments of this application, the feeding line and the radiator of the antenna unit may alternatively have a specific spacing, to apply a coupled feeding manner. For example, the patch antenna is still used as an example. As shown in FIG. 19, a surface layer conductor patch 402, a bottom layer conductor patch 403, and a ground plate 405 in an antenna unit are sequentially stacked. A feeding line 404 is on a side that is of the ground plate 405 and that is away from the patch, the ground plate 405 may have a hole or a slot, and the feeding line 404 implements coupled feeding of the surface layer conductor patch 402 and coupled feeding of the bottom layer conductor patch 403 by using the hole or the slot. A conducting wire of a capacitive sensor may be led out from a minimum-voltage point on the surface layer conductor patch 402, or may be led out from a minimum-voltage point on the bottom layer conductor patch 403, or may be led out from a minimum-voltage point on another conductor patch. This is not specifically limited in embodiments of this application. When the conducting wire is led out from the surface layer conductor patch 402, the conducting wire may pass through a lower-layer conductor patch. Alternatively, a hole may be opened on the lower-layer conductor patch to avoid the conducting wire. It should be noted that when the electronic device includes a plurality of antenna units, each of the plurality of antenna units includes a feeding line and a radiator. Feeding lines of the plurality of antenna units may be disposed separately, or may be shared in a part. This is not limited in embodiments of this application.

In embodiments of this application, a location at which the conducting wire is led out from the radiator of the antenna unit in the electronic device is a location of the minimum-voltage point on the radiator. In some other embodiments, when a voltage at a specific location on the radiator is not higher than a specific threshold (for example, a difference between the voltage at the location and a voltage at the location of the minimum-voltage point is less than a specific threshold), a conducting wire may alternatively be led out from the location and connected to the sensor chip, to achieve the foregoing effects.

An implementation solution of the capacitive sensor provided in embodiments of this application may be applied to any antenna unit. An applied patch antenna includes but is not limited to a single-patch antenna, a patch antenna array, and an antenna-in-package (antenna-in-package, AIP). An operating frequency band of the antenna unit includes but is not limited to a 2G/3G/4G frequency band, a cellular frequency band, a Wi-Fi frequency band, a Bluetooth frequency band, a GPS frequency band, a 5G communication frequency band, a 6 GHz frequency band, and a millimeter wave (millimeter wave, mmW) frequency band (from 10 GHz to 300 GHz). Generally, an antenna working in a millimeter wave frequency band may be a patch antenna. An antenna working mode includes but is not limited to a quarter-wavelength mode, a half-wavelength mode, and another higher-order mode. In an antenna-in-package (AIP) technology, an antenna is integrated in a package that carries a chip, by using a packaging material and a packaging process. When the electronic device includes at least one antenna unit, each antenna unit may be an antenna-inpackage, or a plurality of antenna units may be packaged together. In this way, the sensor chip of the capacitive sensor may be packaged together with the antenna unit.

In embodiments of this application, the radiator of the antenna unit is multiplexed as the sensor pad of the capacitive sensor, so that capacitive proximity detection can be implemented without adding an additional sensor pad. Particularly, in a scenario in which an AIP in a millimeter-wave frequency band is used, the AIP and a capacitive sensor may be integrated, to compress volumes of a plurality of functional devices. A sensor chip of the capacitive sensor may be integrated or packaged with a mmW chip die (die), to form a sensor in an antenna-in-package (sensor in AIP, SIAIP).

The capacitive sensor (system) provided in embodiments of this application may perform proximity detection to detect a proximity or a distance level of a detected object, and may be further applied to electromagnetic wave energy absorption rate (specific absorption rate, SAR) detection, maximum permissible exposure (maximum permissible exposure, MPE) detection, gesture detection, antenna beam management, antenna module switching, electronic device posture detection, and the like. For example, the capacitive sensor system provided in embodiments of this application is disposed in an electronic device. A radiator of an antenna unit in the electronic device may be configured to receive and transmit a radio frequency signal, and may also be configured to sense capacitance or a capacitance change between the radiator and a detected object when the detected object approaches and transmit a signal corresponding to the capacitance or the capacitance change to a sensor chip. The sensor chip may obtain a distance or a proximity between the detected object and the radiator by processing the capacitive sensing signal. In this case, if the distance between the detected object and the radiator is less than a preset threshold, the electronic device may change a beam direction of an antenna, and does not transmit or receive a radio frequency signal in a direction of the detected object, to prevent the signal from being blocked by the detected object. Alternatively, in this case, if the distance between the detected object and the radiator is less than a preset threshold, the electronic device may change and switch an antenna module, so that an antenna module that is not in a direction of the detected object works, to prevent a signal from being blocked by the detected object. Alternatively, in this case, if the distance between the detected object and the radiator is less than a preset threshold, the electronic device may reduce transmit power of the antenna, to meet an SAR limit. For another example, the sensor chip may obtain a distance change between the detected object and the radiator by processing a capacitive sensing signal, so that the electronic device may identify a gesture of a user, detect a posture of the electronic device, or the like based on the distance change.

It should be understood that, in some accompanying drawings of embodiments of this application, a circle marked on the radiator represents a cross section of the conducting wire, and x in the circle represents a current flow direction. In embodiments of this application, it indicates that a current flows from the radiator to the sensor chip.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. An electronic device, comprising:
a first antenna unit comprising a first radiator, configured to receive and transmit a radio frequency signal, and to sense a capacitance or a capacitance change between the first radiator and a detected object; and
a sensor chip configured to obtain the capacitance or the capacitance change, to determine a proximity of the detected object relative to the first radiator, wherein the sensor chip is configured to be electrically connected to a minimum-voltage point on the first radiator by a conducting wire,
wherein a feeding manner of the first antenna unit is direct feeding, wherein a high-pass filter circuit is configured to be connected in series to a radio frequency path of the first antenna unit and block a low-frequency signal corresponding to the capacitance or the capacitance change.

2. The electronic device according to claim 1, wherein the electronic device further comprises a second antenna unit comprising a second radiator, wherein a minimum-voltage point on the second radiator is configured to be electrically connected to the sensor chip by a conducting wire, and wherein the conducting wires configured to be connected to the first radiator and the second radiator are combined into one path or a plurality of paths that are configured to be connected to the sensor chip.

3. The electronic device according to claim 2, wherein the first antenna unit and the second antenna unit belong to a same antenna array.

4. The electronic device according to claim 1, wherein the conducting wire is a low-pass high-resistance wire.

5. The electronic device according to claim 1, wherein another high-pass filter circuit configured to filter out the radio frequency signal is disposed on a path between the first radiator and the sensor chip.

6. The electronic device according to claim 1, wherein the first antenna unit is a patch antenna, wherein the first radiator comprises one or more layers of conductor patches, and wherein the conducting wire is configured to be connected to a layer of conductor patch in the one or more layers of conductor patches.

7. The electronic device according to claim 1, wherein the high-pass filter circuit is a capacitor circuit.

8. The electronic device according to claim 1, wherein the first antenna unit is a patch antenna.

9. An electronic device, comprising:
a first antenna unit comprising a first radiator, configured to receive and transmit a radio frequency signal, and to sense a capacitance or a capacitance change between the first radiator and a detected object; and
a sensor chip configured to obtain the capacitance or the capacitance change, to determine a proximity of the detected object relative to the first radiator, wherein the sensor chip is configured to be electrically connected to a minimum-voltage point on the first radiator by a conducting wire, wherein the first antenna unit is a patch antenna, wherein the first radiator comprises one or more layers of conductor patches, and wherein the conducting wire is configured to be connected to a layer of conductor patch in the one or more layers of conductor patches, wherein the first antenna unit further comprises a feeding line, and wherein, when the feeding line and the conducting wire are configured to be connected to a same conductor patch, a high-pass filter circuit is configured to be connected in series to a radio frequency path of the first antenna unit and block a low-frequency signal corresponding to the capacitance or the capacitance change.

10. The electronic device according to claim 9, wherein the electronic device further comprises a second antenna unit comprising a second radiator, wherein a minimum-voltage point on the second radiator is configured to be electrically connected to the sensor chip by a conducting wire, and wherein the conducting wires configured to be connected to the first radiator and the second radiator are combined into one path or a plurality of paths that are configured to be connected to the sensor chip.

11. The electronic device according to claim 10, wherein the first antenna unit and the second antenna unit belong to a same antenna array.

12. The electronic device according to claim 9, wherein the conducting wire is a low-pass high-resistance wire.

13. The electronic device according to claim 9, wherein another first high-pass filter circuit configured to filter out the radio frequency signal is disposed on a path between the first radiator and the sensor chip.

* * * * *